US012392193B2

(12) United States Patent
Glover et al.

(10) Patent No.: US 12,392,193 B2
(45) Date of Patent: Aug. 19, 2025

(54) ADJUSTABLE FRAME WITH A THERMAL BREAK

(71) Applicant: AADG, INC., New Haven, CT (US)

(72) Inventors: Daniel Brian Glover, Franklin, TN (US); Patrick Middleton, Medina, TN (US)

(73) Assignee: AADG, INC., New Haven, CT (US)

( * ) Notice: Subject to any disclaimer, the term of this patent is extended or adjusted under 35 U.S.C. 154(b) by 471 days.

(21) Appl. No.: 17/831,653

(22) Filed: Jun. 3, 2022

(65) Prior Publication Data

US 2022/0389748 A1    Dec. 8, 2022

Related U.S. Application Data

(60) Provisional application No. 63/278,513, filed on Nov. 12, 2021, provisional application No. 63/278,515,
(Continued)

(51) Int. Cl.
*E06B 3/46* (2006.01)
*E06B 1/20* (2006.01)
(Continued)

(52) U.S. Cl.
CPC ............... *E06B 7/16* (2013.01); *E06B 1/20* (2013.01); *E06B 1/52* (2013.01); *E06B 1/6015* (2013.01);
(Continued)

(58) Field of Classification Search
CPC . E06B 1/18; E06B 1/20; E06B 1/6015; E06B 1/62; E06B 2001/622
See application file for complete search history.

(56) References Cited

U.S. PATENT DOCUMENTS 2,860,744 A    11/1958  Mascari
3,248,833 A     5/1966  Sklar
(Continued)

FOREIGN PATENT DOCUMENTS

CA        3062210 A1        5/2021
DE    102010049762 B3 *    3/2012  ............... E06B 1/18
WO   WO-2005121483 A1 *  12/2005  ............... E06B 1/20

OTHER PUBLICATIONS

AADG, Inc., Canadian Patent Application No. 3,161,750, Office Action, Nov. 1, 2023.
(Continued)

*Primary Examiner* — Christine T Cajilig
(74) *Attorney, Agent, or Firm* — Moore & Van Allen PLLC; Jeffrey R. Gray

(57) ABSTRACT

A frame may comprise three or more portions comprising an upper portion disposed adjacent an upper end of an opening and two side portions disposed along either edge of the opening, and in some cases a lower portion adjacent a lower end of an opening. A first frame segment and the second frame segment are adjustable with respect to each other in order to extend around the thickness of the opening. A third segment, such as a soffit segment may be utilized to cover at least a portion of the segments. The first frame segment, the second frame segment, and/or the soffit segment may have one or more barriers located between portions of the segments. The first frame segment may be adjusted with respect to the second frame segment, and the adjustment may be made before or after activation of the one or more barriers.

17 Claims, 20 Drawing Sheets

Related U.S. Application Data filed on Nov. 12, 2021, provisional application No. 63/276,227, filed on Nov. 5, 2021, provisional application No. 63/276,230, filed on Nov. 5, 2021, provisional application No. 63/197,770, filed on Jun. 7, 2021.

(51) Int. Cl.
*E06B 1/52* (2006.01)
*E06B 1/60* (2006.01)
*E06B 1/62* (2006.01)
*E06B 3/263* (2006.01)
*E06B 7/16* (2006.01)
*H05K 9/00* (2006.01)

(52) U.S. Cl.
CPC ............ *E06B 1/62* (2013.01); *E06B 3/26301* (2013.01); *E06B 3/26336* (2013.01); *E06B 3/4636* (2013.01); *H05K 9/0003* (2013.01); *H05K 9/0081* (2013.01); *E06B 2001/622* (2013.01); *E06B 2003/2635* (2013.01)

(56) References Cited

U.S. PATENT DOCUMENTS

| | | | |
|---|---|---|---|
| 3,420,003 A | | 1/1969 | Cline |
| 3,571,995 A | * | 3/1971 | Kasprzak .................. E06B 1/20 49/505 |
| 3,609,928 A | | 10/1971 | Mock |
| 3,654,734 A | | 4/1972 | Lehman |
| 3,788,019 A | | 1/1974 | Kiselewski |
| 3,793,788 A | * | 2/1974 | Collins ..................... E06B 1/20 52/214 |
| 3,906,671 A | | 9/1975 | Maldonado |
| 4,018,022 A | | 4/1977 | Fink |
| 4,642,954 A | | 2/1987 | Sigerist |
| 4,674,248 A | | 6/1987 | Hall |
| 4,705,916 A | | 11/1987 | Wadhera et al. |
| 4,735,025 A | | 4/1988 | Day |
| 4,782,630 A | | 11/1988 | Kleyn |
| 4,791,758 A | | 12/1988 | Bauer et al. |
| 4,878,325 A | | 11/1989 | Van Tuyl et al. |
| 4,986,034 A | * | 1/1991 | Mozuras .................. E06B 1/20 49/505 |
| 5,070,651 A | * | 12/1991 | Jeter ....................... E06B 1/045 49/505 |
| 5,187,898 A | | 2/1993 | Mckann |
| 5,220,748 A | | 6/1993 | Chadbourne |
| 5,233,802 A | * | 8/1993 | Rogers ..................... E06B 1/20 49/505 |
| 5,294,270 A | | 3/1994 | Fenical |
| 5,345,722 A | | 9/1994 | Mckann |
| 5,392,574 A | | 2/1995 | Sayers |
| 5,412,909 A | | 5/1995 | Wu |
| 6,050,036 A | | 4/2000 | Frey |
| 6,282,851 B1 | | 9/2001 | Beaton |
| 6,639,145 B1 | | 10/2003 | Nurmi |
| 7,340,866 B1 | | 3/2008 | Smith |
| 8,650,818 B1 | | 2/2014 | Smith |
| 8,806,812 B2 | * | 8/2014 | Kolovich .............. E06B 1/6046 52/126.4 |
| 9,115,501 B2 | * | 8/2015 | Rucinski ............... E06B 1/6023 |
| 10,273,742 B2 | * | 4/2019 | Strickland ................ E06B 3/76 |
| 10,851,572 B1 | | 12/2020 | Flynn |
| 11,286,712 B2 | | 3/2022 | Macdonald et al. |
| 2007/0022699 A1 | | 2/2007 | Wang |
| 2009/0077912 A1 | | 3/2009 | Yeremian |
| 2010/0212239 A1 | | 8/2010 | Wang |
| 2011/0179730 A1 | | 7/2011 | Kolovich et al. |
| 2013/0192163 A1 | | 8/2013 | Tatrault |
| 2018/0038149 A1 | * | 2/2018 | Strickland ............... E06B 3/822 |
| 2019/0128048 A1 | | 5/2019 | Macdonald et al. |
| 2021/0047880 A1 | | 2/2021 | Gosling et al. |
| 2021/0324675 A1 | | 10/2021 | Liang et al. |
| 2022/0389749 A1 | | 12/2022 | Glover et al. |
| 2022/0389750 A1 | | 12/2022 | Glover et al. |
| 2022/0389757 A1 | | 12/2022 | Glover et al. |

OTHER PUBLICATIONS

Cambridge Dictionary, "adjustable," https://dictionary.cambridge.org/us/dictionary/english/adjustable (last accessed on Sep. 23, 2024) (Year: 2024).

* cited by examiner

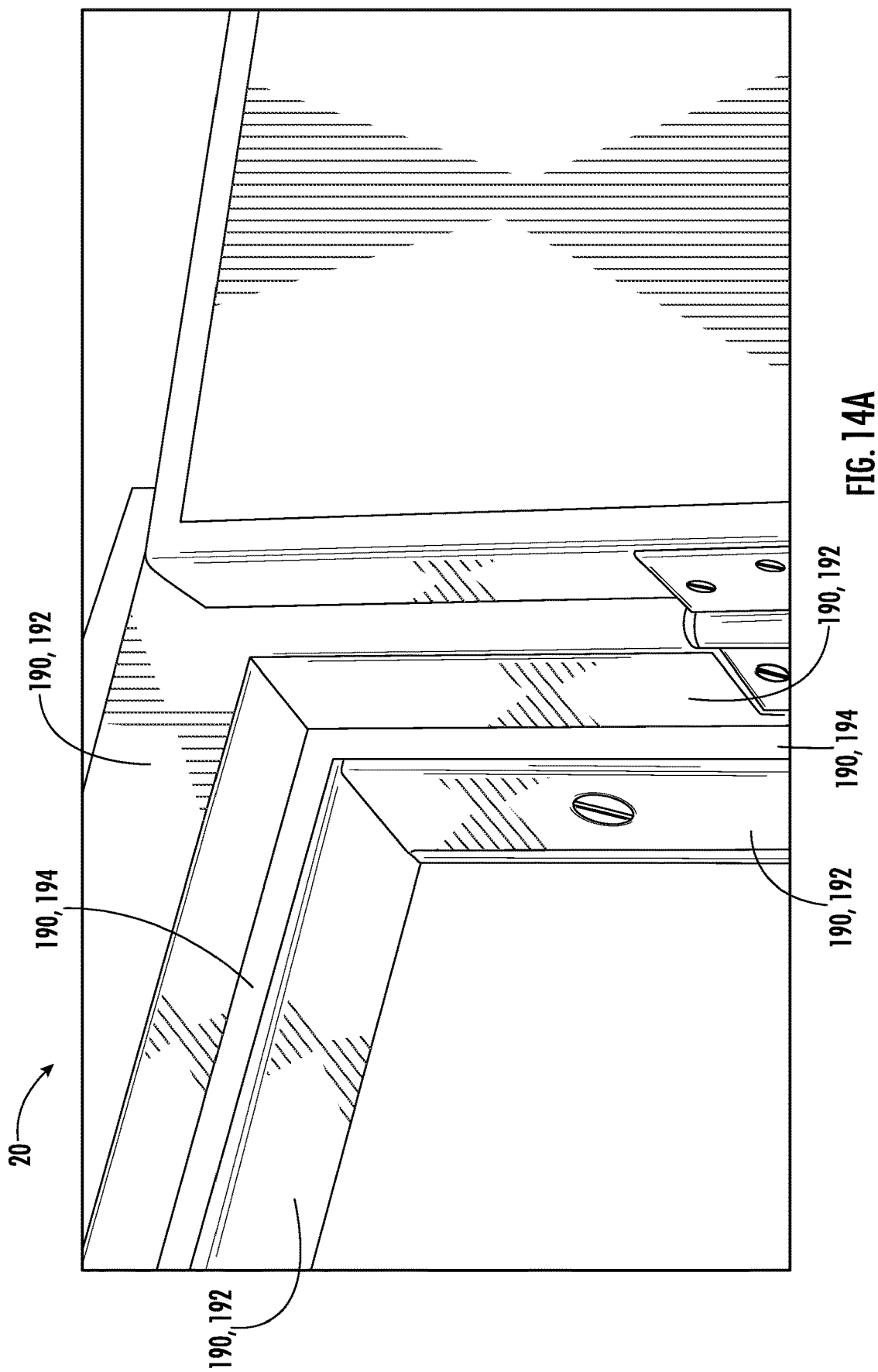

ADJUSTABLE FRAME WITH A THERMAL BREAK

CROSS REFERENCE AND PRIORITY CLAIM UNDER 35 U.S.C. § 119

The present application for a patent claims priority to U.S. Provisional Patent Application Ser. No. 63/278,515 entitled "Adjustable Door Frame for a Sliding Door" filed on Nov. 12, 2021, U.S. Provisional Patent Application Ser. No. 63/278,513 entitled "Security Features for a Sliding Door System" filed on Nov. 12, 2021, U.S. Provisional Patent Application Ser. No. 63/276,227 entitled "Adjustable Frame with a Thermal Break Seal" filed on Nov. 5, 2021, U.S. Provisional Patent Application Ser. No. 63/276,230 entitled "Adjustable Frame With a Thermal Break" filed on Nov. 5, 2021, U.S. Provisional Patent Application Ser. No. 63/197,770 entitled "Adjustable Door Frame With a Thermal Break" filed on Jun. 7, 2021, all of which are assigned to the assignees hereof and hereby expressly incorporated by reference herein.

FIELD

Embodiments of the present disclosure generally relate to door frames for a door opening, and in particular, to adjustable door frames having a thermal break to reduce conductive heat losses and air infiltration/exfiltration from one side of the door frame to the other and for assembly of the door frames with walls of different thicknesses.

BACKGROUND

Common door openings are subject to thermal and/or air leakage, which results in higher energy costs for building owners. Moreover, walls within a building, such as within individual rooms, between rooms, and/or between floors may be of different sizes, and thus, require different door frames.

SUMMARY

As will be described herein, embodiments of the door frame may comprise three or more portions (e.g., three for a door, four for a window, or the like) comprising an upper portion disposed adjacent an upper end of a door opening and two side portions disposed along either edge of the door opening (and a lower portion for a window or in some cases a door). One side portion may be located on the hinge side of the door and the opposite side portion may be located on the latch side of the door. Each of the door frame portions may be made up of a pair of elongated frame segments of sufficient length to fit the door opening and door. The frame segments are assembled around the opening edges a of wall. A first frame segment may be disposed on the outer side of the door opening (e.g., the side of wall that is normally outside of the door), and second frame segment may be disposed on the inner side of the door opening (e.g., the side of the wall that is normally enclosed by the door). However, in some embodiments the first frame segment may be disposed on the inner side of the door opening and the second frame segment may be disposed on the outer side of the door opening. The frame portions may be secured to each other and the adjoining structure by frame connectors (e.g., clips, tabs, fasteners, and/or the like). A door may be hung conventionally within the door opening by hinges secured by fasteners through openings to hinge reinforcements in one (a single hinged door) or both (for a double door) of the frame side portions so that the door face contacts stop flanges of the door frame. The door may be any type of conventional door, any customized door, or the like.

The first frame segment and the second frame segment of the door frame are adjustable with respect to each other in order to extend around the thickness of the door opening. A third segment, such as a soffit segment, may be utilized to cover at least a portion of the first frame segment and the second frame segment. A fourth segment, such as an adjustment mounting segment, may be operatively coupled to the first frame segment to allow for adjustment and mounting of the first frame segment and the second frame segment. Moreover, the first frame segment, the second frame segment, the soffit segment, and/or the adjustment mounting segment may have one or more barriers (e.g., tape, adhesive, sealant, caulk, coatings, or the like) located between portions of the segments that provide thermal protection, air infiltration/exfiltration, or other security features. The first frame segment may be adjusted with respect to the second frame segment. The adjustment may be made before or after the one or more thermal barriers are activated (e.g., installed, applied, exposed, triggered, or the like). The segments may be operatively coupled together through the use of one or more segment connectors (e.g., clips, tabs, fasteners, and/or the like).

One embodiment of the invention comprises a frame for an opening. The frame comprising at least one first frame segment, at least one second frame segment, and one or more adjustment members operatively coupled to the at least one first frame segment or the at least one second frame segment. The second frame segment is adjustable with respect to the first frame segment through the use of the one or more adjustment members.

In further accord with embodiments, the frame comprises one or more thermal barriers between a portion of the at least one first frame segment and a portion of the at least one second frame segment.

In other embodiments, the at least one first frame segment comprises one or more first adjustment members and the at least one second frame segment comprises one or more second adjustment members, wherein the at least one second frame segment is adjustable with respect to the at least one first frame segment through the use of the one or more first adjustment members and the one or more second adjustment members.

In still other embodiments, the first frame segment comprises one or more access apertures, wherein the one or more access apertures are configured to allow the one or more first adjustment members to be operatively coupled to the one or more second adjustment members through a portion of the first frame segment as the frame is installed in the opening.

In yet other embodiments, the frame further comprises at least one soffit frame segment. The soffit frame segment covers a portion of the at least one first frame segment and a portion of the at least one second frame segment.

In other embodiments, the at least one soffit frame segment comprises a first soffit stop flange, a soffit face flange adjacent to the first soffit stop flange, a second soffit stop flange adjacent the soffit face flange, and a soffit mounting flange adjacent the second soffit stop flange.

In further accord with embodiments, the at least one second frame segment is adjustable with respect to the at least one first frame segment and the at least one soffit frame segment.

In other embodiments, alternate soffit frame segments may be interchanged to allow for alternate frame widths.

In yet other embodiments, the frame further comprises one or more connectors, wherein the one or more connectors extend through the at least one second frame segment, one of one or more barriers, and the at least one soffit frame segment.

In still other embodiments, the at least one first frame segment comprises a first molding flange, a first jamb flange adjacent to the first molding flange, a first stop flange adjacent to the first jamb flange, and a first face flange adjacent to the first stop flange.

In other embodiments, the at least one second frame segment comprises a second molding flange, and a second jamb flange adjacent to the second molding flange. The one or more adjustment members are one or more second adjustment members adjacent to the second jamb flange.

In further accord with embodiment, the frame further comprises one or more connectors, wherein the one or more connectors operatively couple the one or more adjustment members of the at least one second frame segment to the at least one first frame segment.

In other embodiments the one or more adjustment members comprise one or more adjustment tabs having one or more apertures, and wherein the one or more connectors operatively couple the one or more adjustment tabs to the at least one first frame segment.

In yet other embodiments, the frame further comprises an adjustment mounting segment operatively coupled to the first frame segment. The one or more adjustment members are operatively coupled to the adjustment mounting segment.

In still other embodiments, the adjustment mounting segment comprises an adjustment stop flange, an adjustment face flange extending from the adjustment stop flange, and an adjustment mounting flange extending from the adjustment stop flange.

Another embodiment of the invention comprises a frame for an opening. The frame comprising at least one first frame segment for upper or side portions of the opening, the at least one first frame segment having a first molding flange, a first jamb flange adjacent to the first molding flange, a first stop flange adjacent to the first jamb flange and a first face flange adjacent to the first stop flange. The frame further comprising at least one second frame segment for upper and side portions of the opening, the at least one second frame segment having a second molding flange and a second jamb flange adjacent to the second molding flange. The frame further comprising one or more adjustment members operatively coupled to the at least one first frame segment or the at least one second frame segment. The at least one first frame segment is adjustable with respect to the at least one second frame segment through the one or more second adjustment members.

In further accord with embodiments, the frame further comprises at least one soffit frame segment for the upper and side portions of the opening, the at least one soffit frame segment having a first soffit stop flange, a soffit face flange adjacent to the first soffit stop flange, a second soffit stop flange adjacent the soffit face flange, and a soffit mounting flange adjacent the second soffit stop flange. The first soffit stop flange extends over the first stop flange and the first face flange, and wherein the soffit mounting flange extends over the second jamb flange.

In other embodiments, the frame further comprises one or more barriers between the first stop flange and the first soffit stop flange, between the first face flange and the soffit face flange, between the second jamb flange and the soffit mounting flange, and between the first jamb flange and the one or more adjustment members. The one or more barriers form a thermal break that reduces thermal conduction between the at least one first frame segment and the at least one second frame segment.

Another embodiment of the invention comprises a method of forming a frame. The method comprises adjusting at least one first frame segment with respect to at least one second frame segment through the use of one or more adjustment members, and securing the at least one first frame segment to the at least one second frame segment through the use of one or more connectors.

In further accord with embodiments, the method comprises applying one or more barriers between the least one first frame segment and the at least one second frame segment. The method further comprises securing at least one soffit frame segment to the at least one first frame member and the at least one second frame member through the one of the one or more connectors. The one or more barriers are further applied between the at least one first frame segment and the at least one soffit segment and the at least one second frame segment and the at least one soffit segment.

To the accomplishment the foregoing and the related ends, the one or more embodiments comprise the features hereinafter described and particularly pointed out in the claims. The following description and the annexed drawings set forth certain illustrative features of the one or more embodiments. These features are indicative, however, of but a few of the various ways in which the principles of various embodiments may be employed, and this description is intended to include all such embodiments and their equivalents.

BRIEF DESCRIPTION OF THE DRAWINGS

Having thus described embodiments of the invention in general terms, reference will now be made to the accompanying drawings.

Figure 1A:
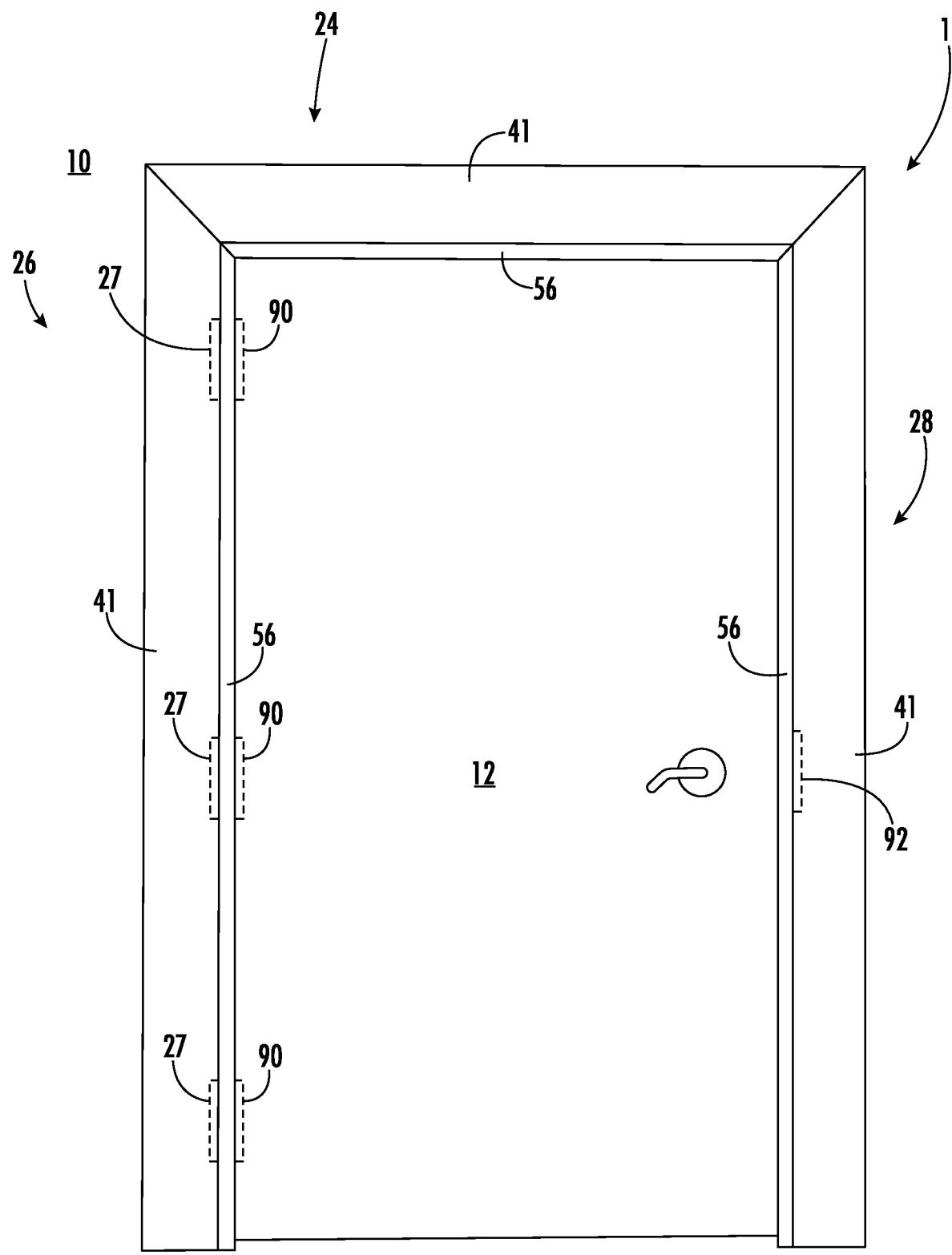

FIG. 1A is front view of one side of the assembled door frame and door, in accordance with some embodiments of the disclosure.

Figure 1B:
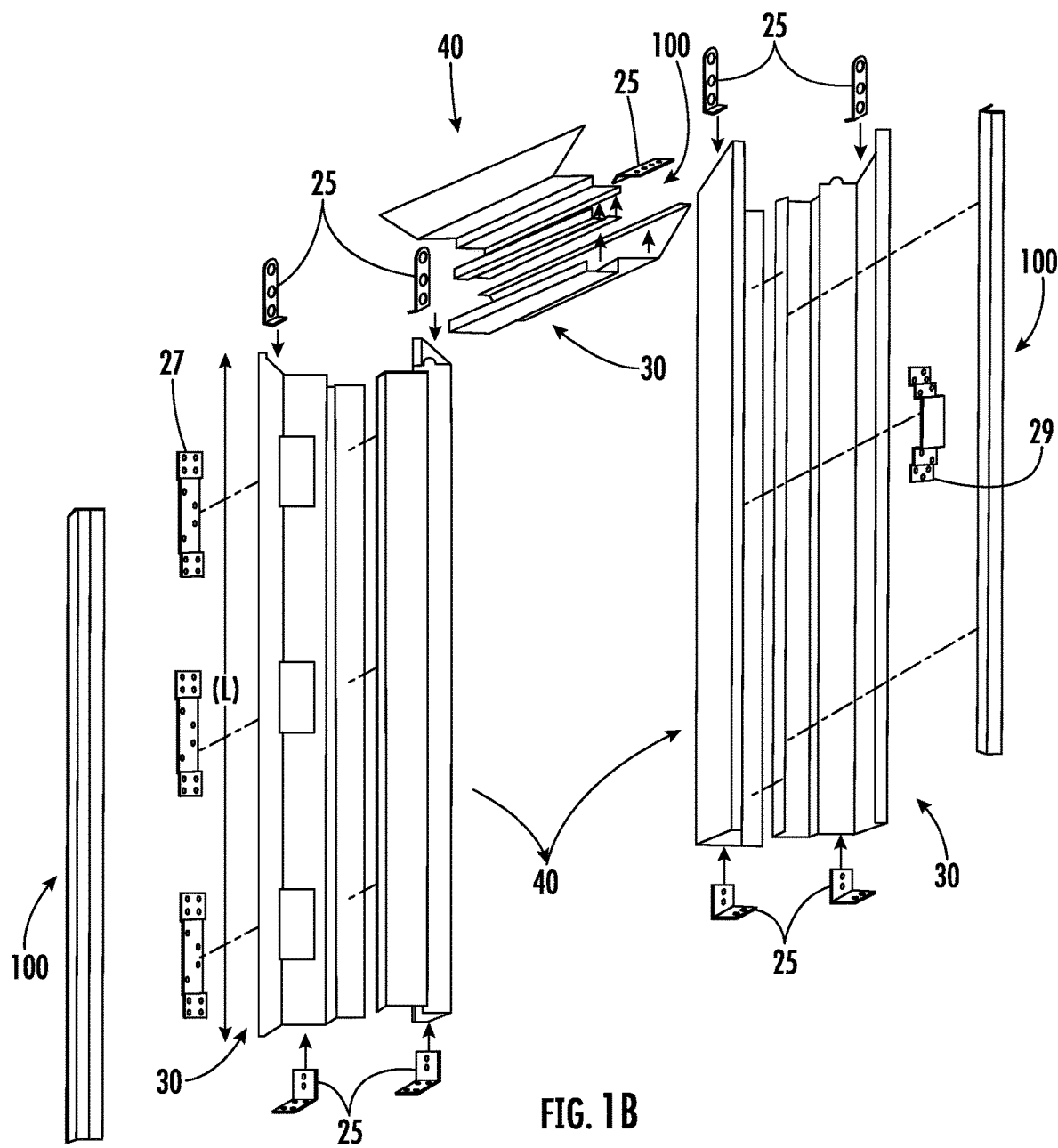

FIG. 1B is an exploded perspective view of a portion of a door frame, in accordance with some embodiments of the disclosure.

Figure 2:
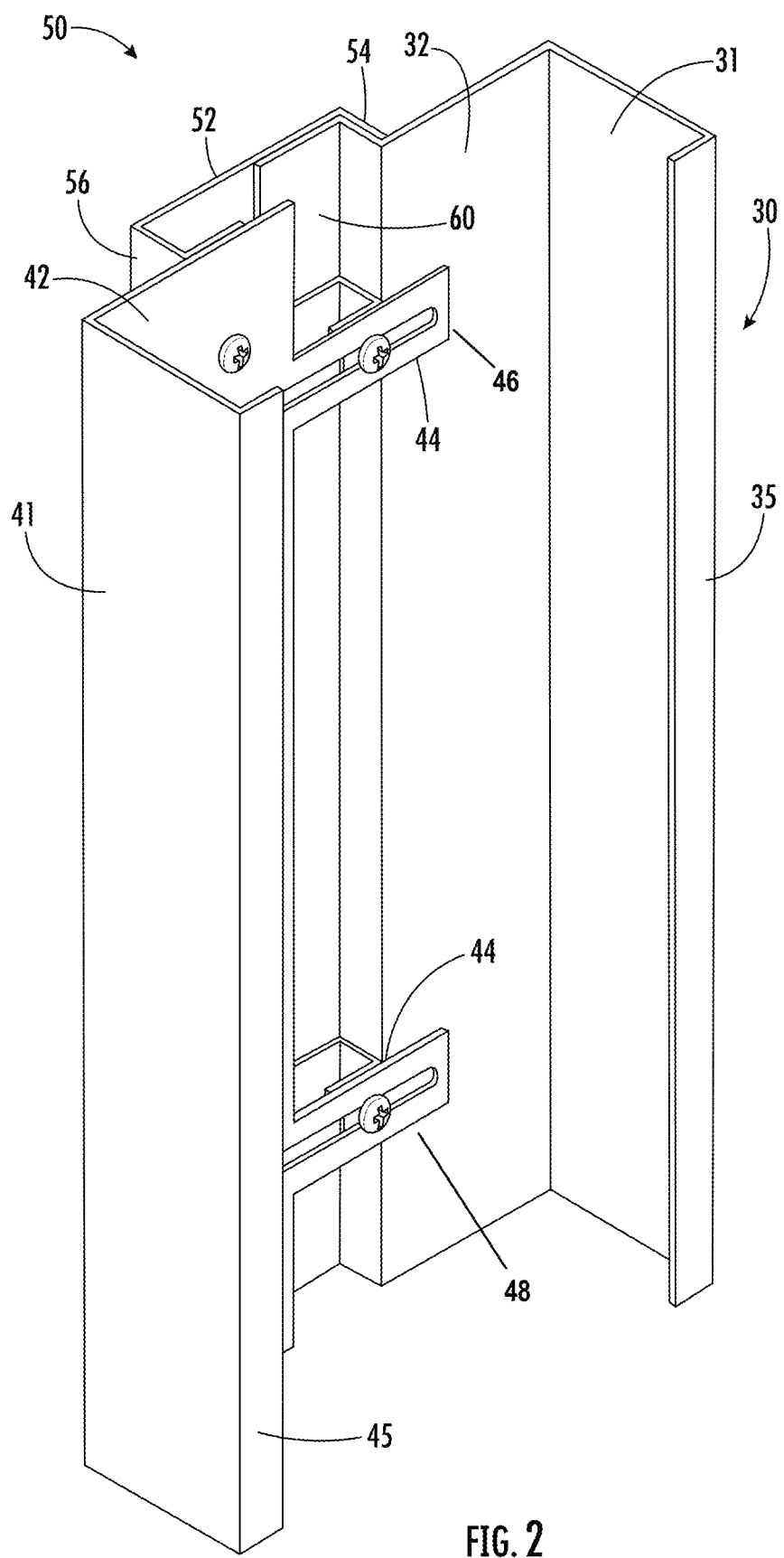

FIG. 2 is a perspective view of a portion of the door frame, in accordance with some embodiments of the disclosure.

Figure 3:
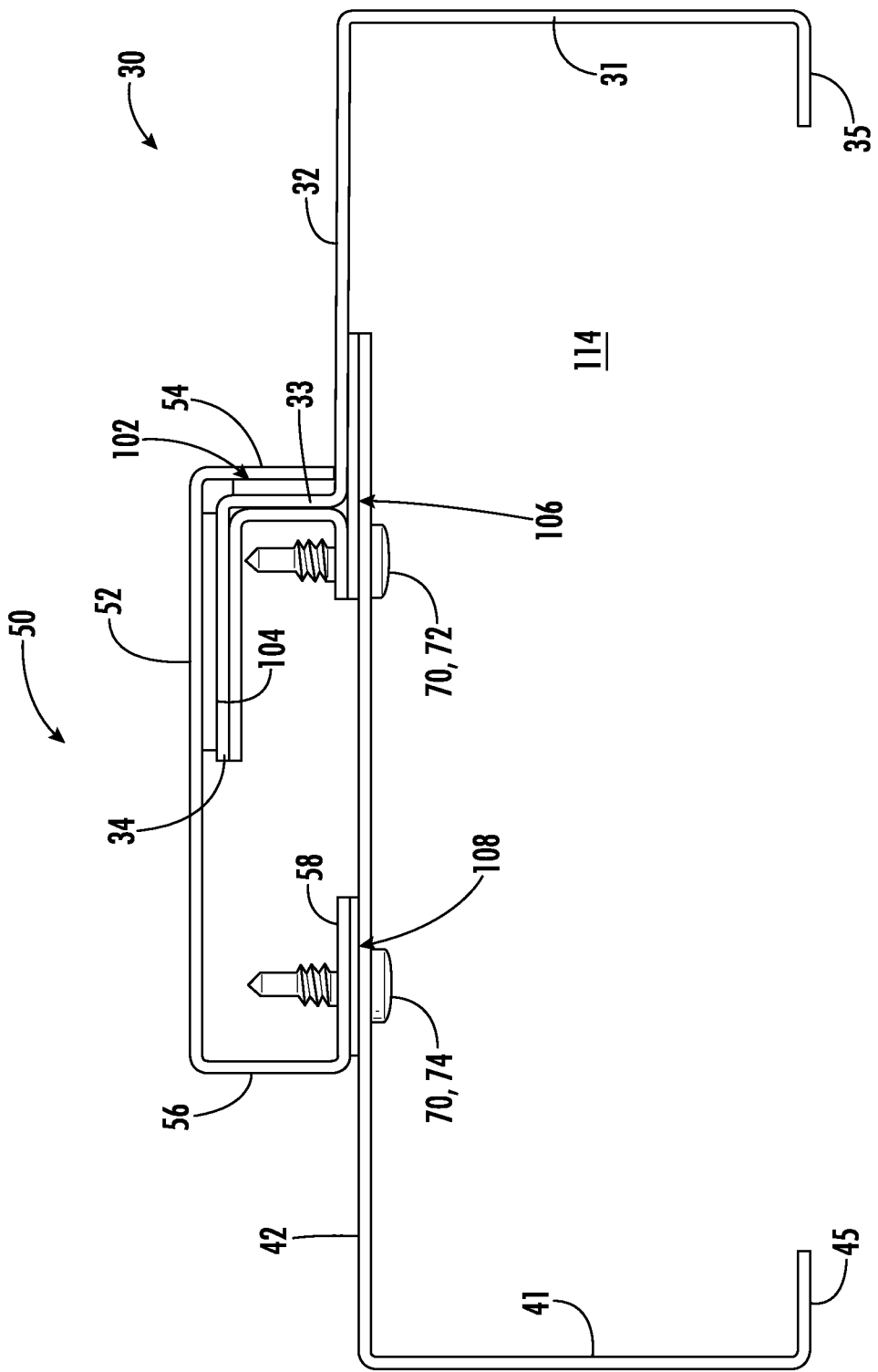

FIG. 3 is a top view of a portion of the door frame, in accordance with some embodiments of the disclosure.

Figure 4:
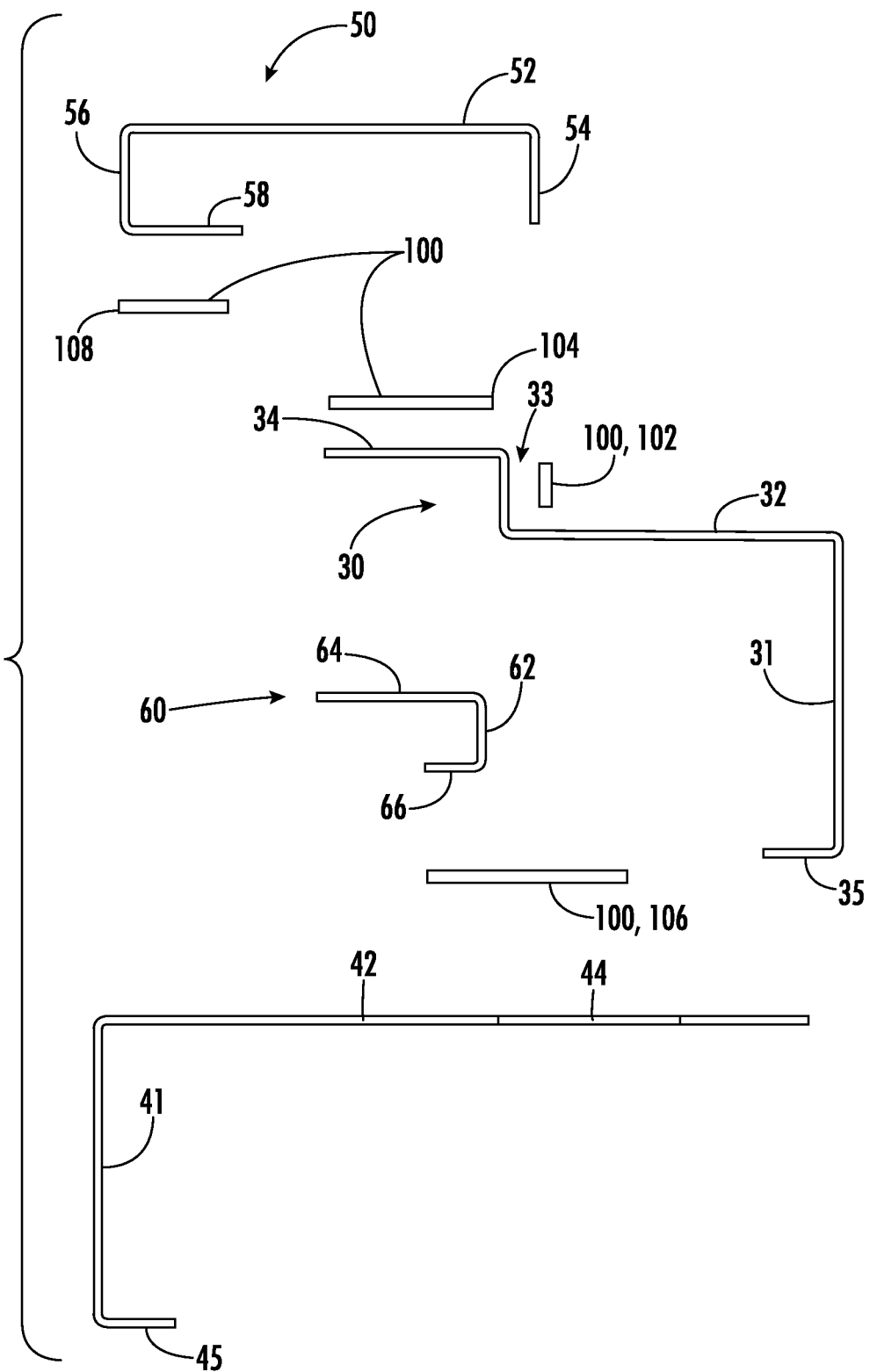

FIG. 4 illustrates an exploded view of a portion of the door frame, in accordance with some embodiments of the disclosure.

Figure 5:
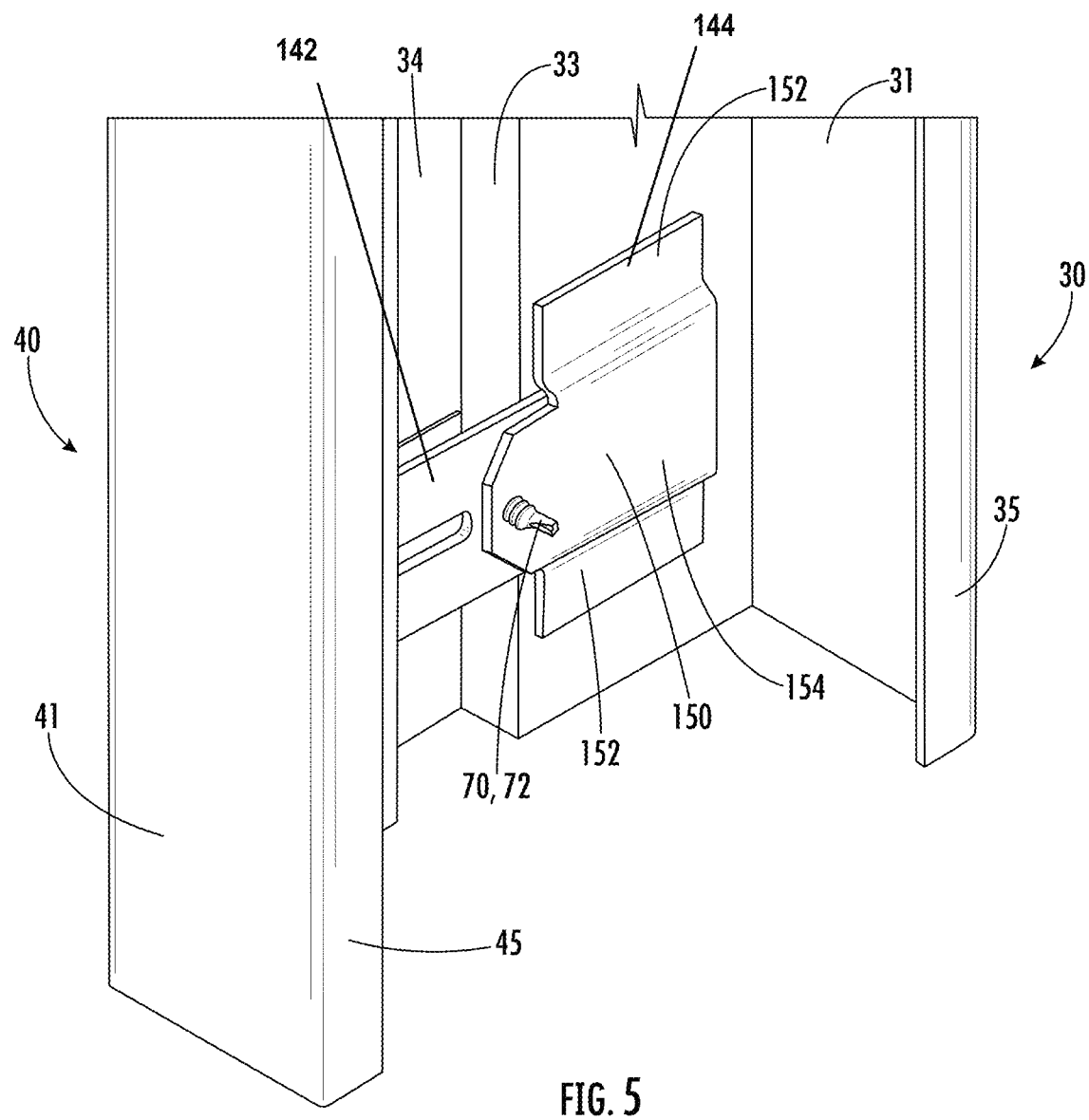

FIG. 5 is a perspective view of a portion of the door frame, in accordance with some embodiments of the disclosure.

Figure 6:
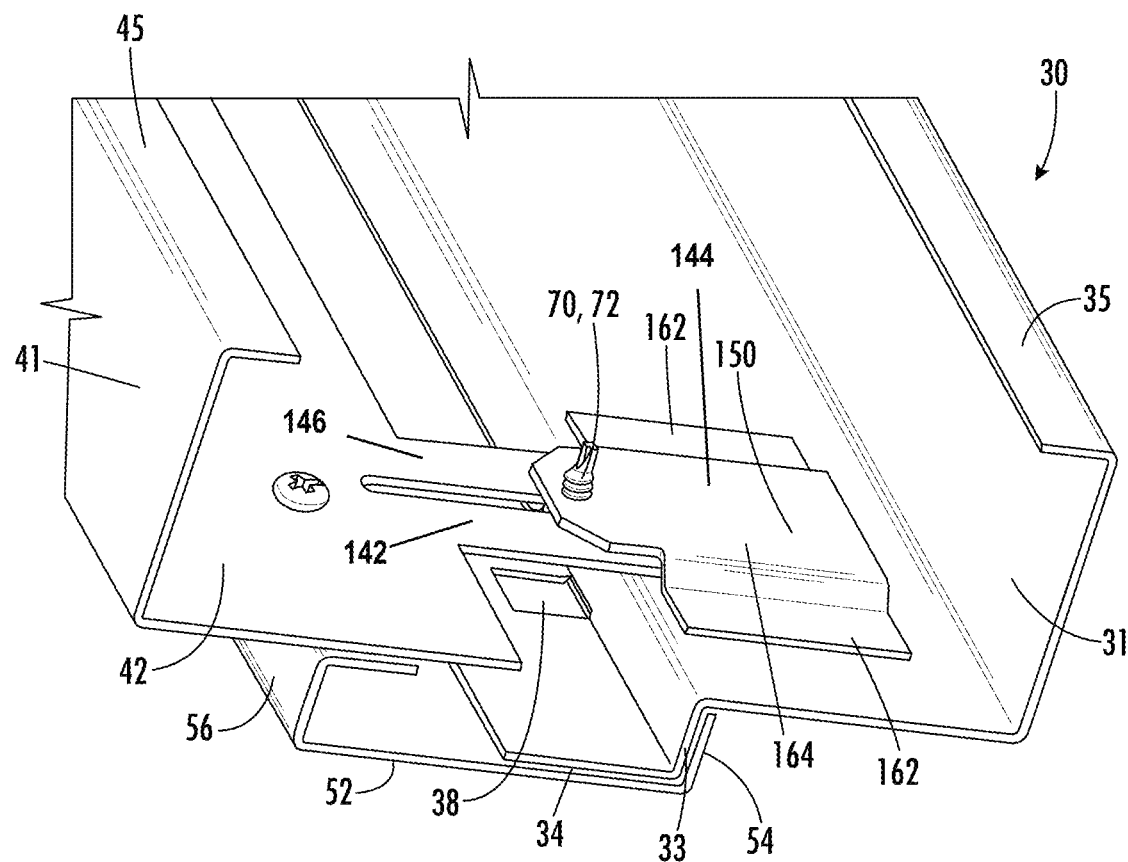

FIG. 6 is a bottom perspective view of a portion of the door frame, in accordance with some embodiments of the disclosure.

Figure 7:
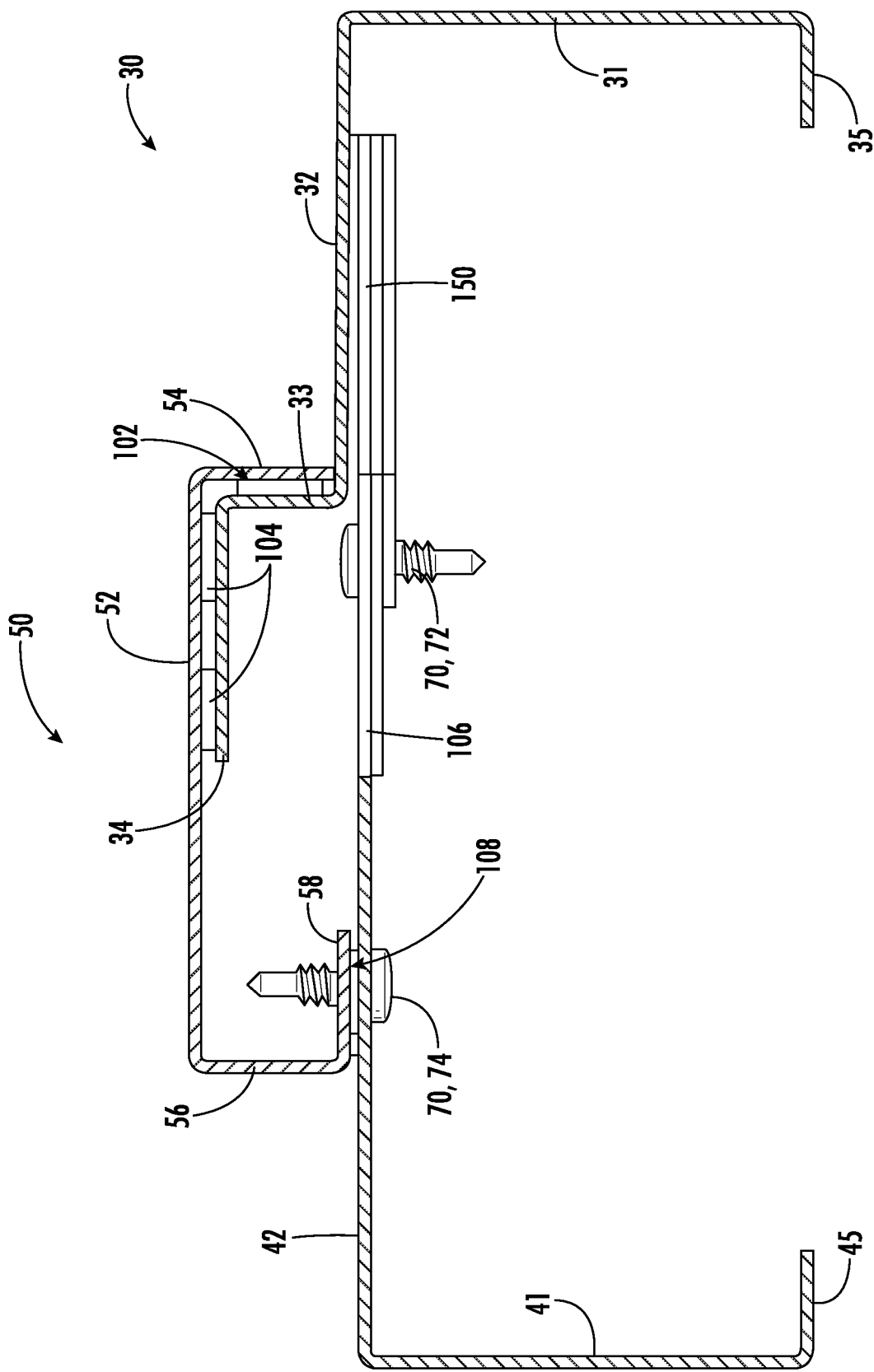

FIG. 7 is a top view of a portion of the door frame, in accordance with some embodiments of the disclosure.

Figure 8:
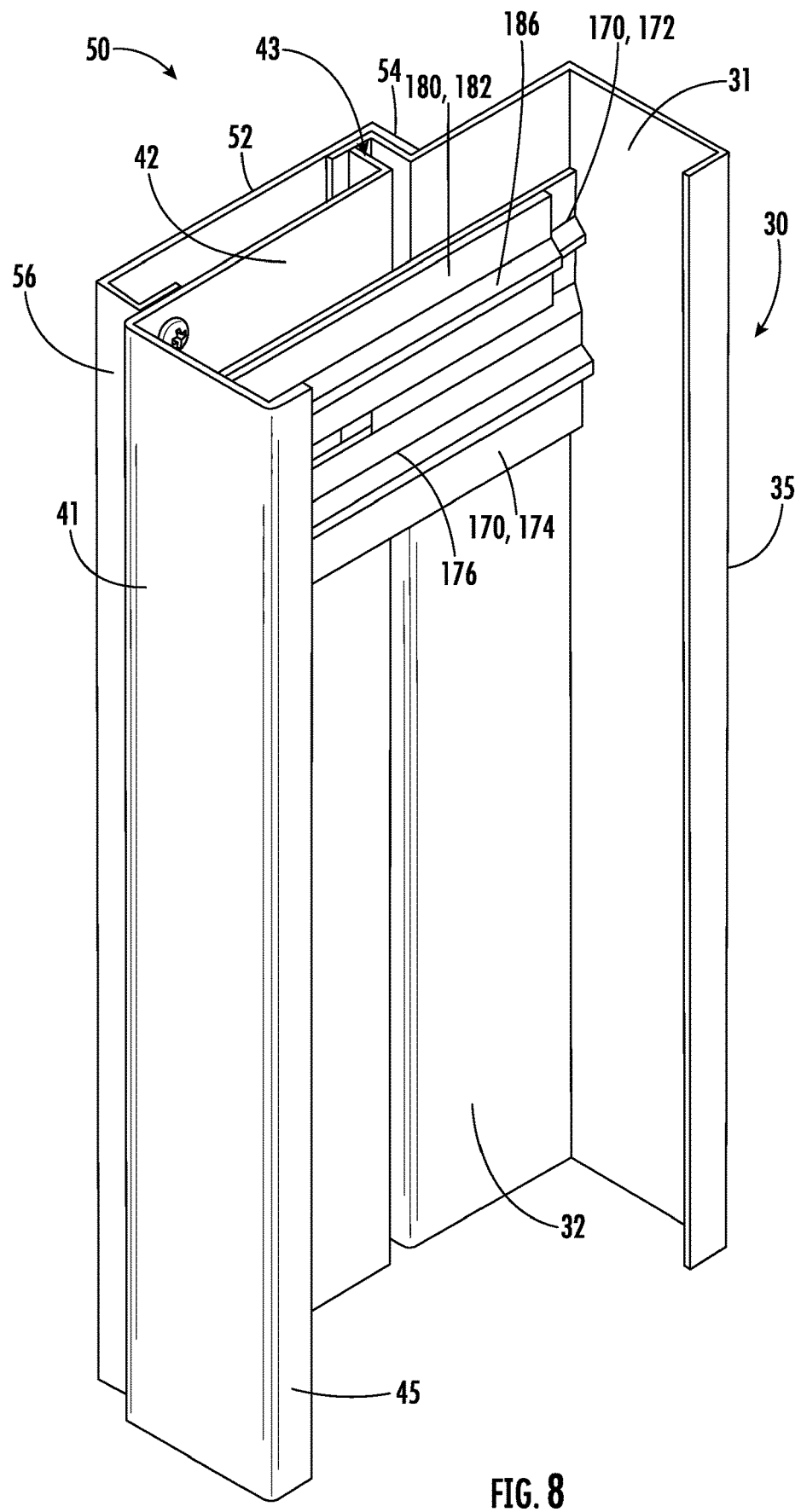

FIG. 8 is a perspective view of a portion of the door frame, in accordance with some embodiments of the disclosure.

Figure 9:
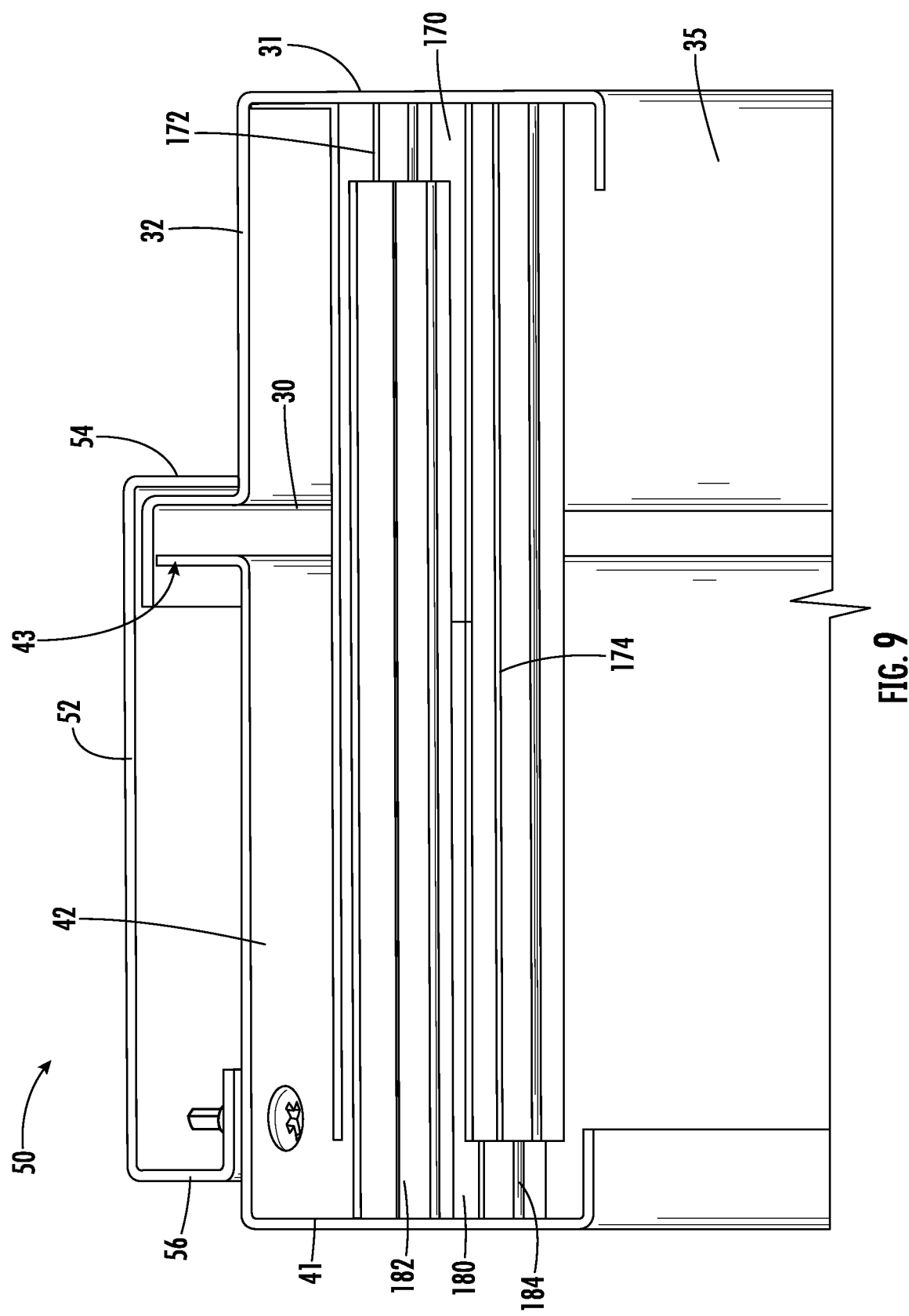

FIG. 9 is a top perspective view of a portion of the door frame, in accordance with some embodiments of the disclosure.

Figure 10:
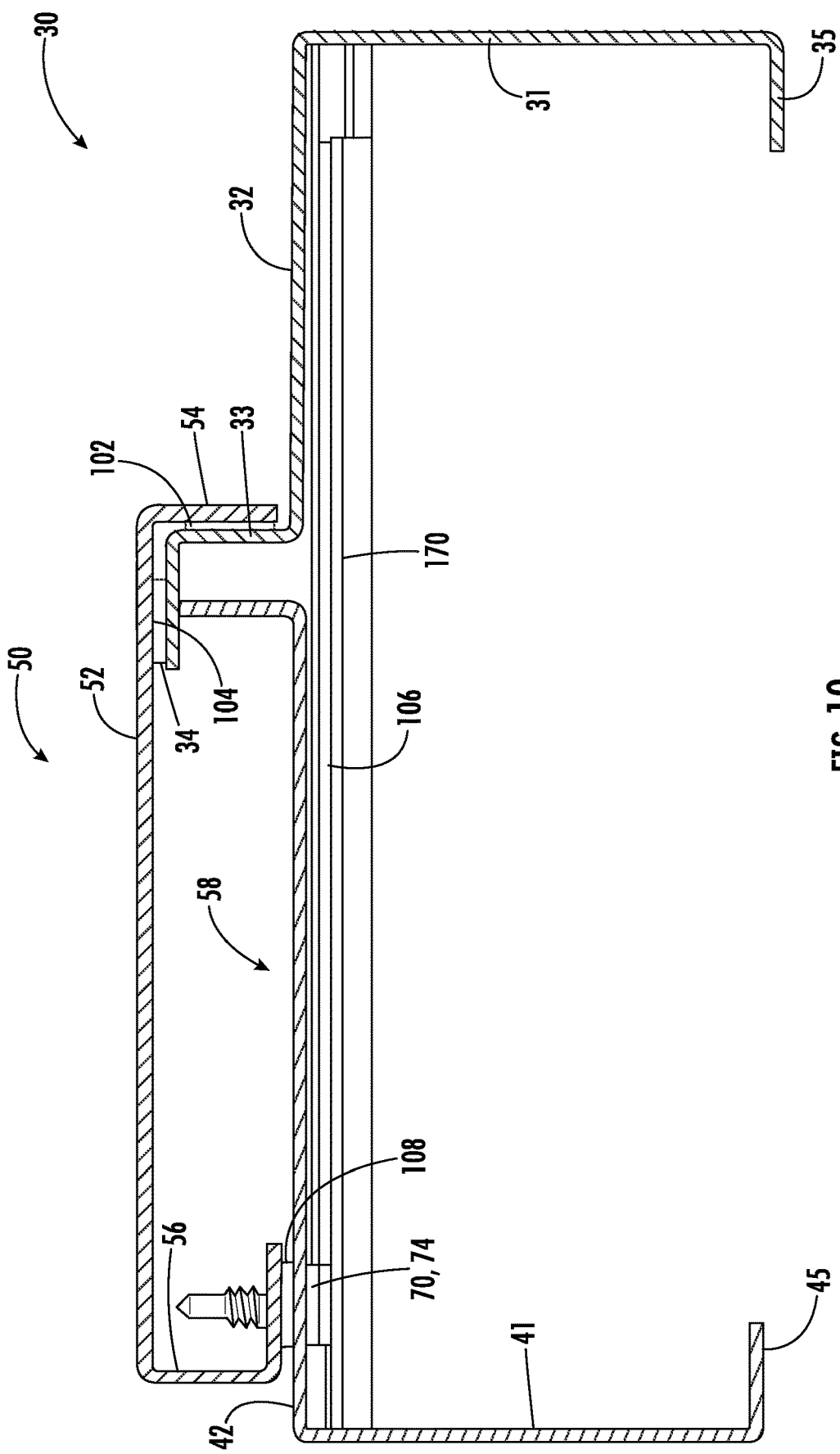

FIG. 10 is a top view of a portion of the door frame, in accordance with some embodiments of the disclosure.

Figure 11A:
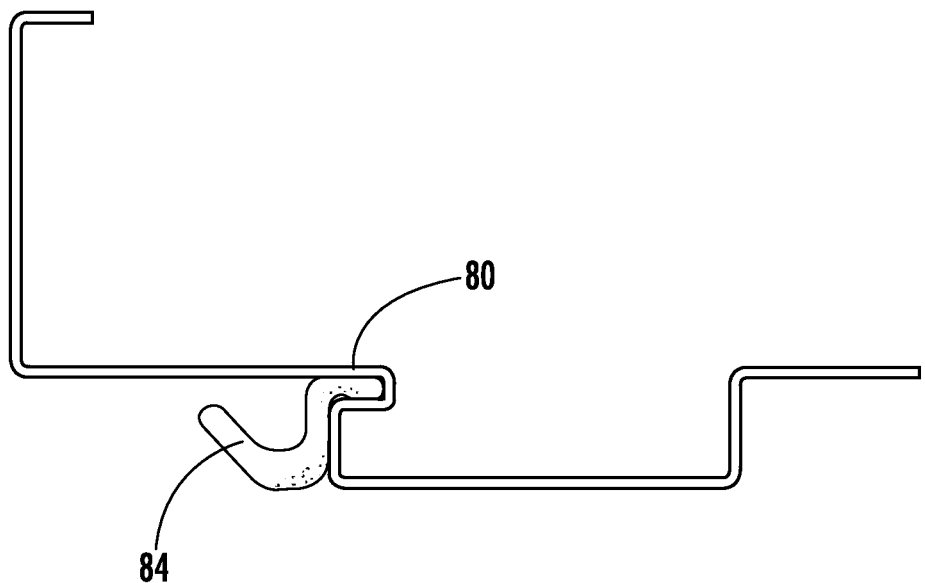

FIG. 11A illustrates a cross-sectional view of a door frame including a seal portion, in accordance with some embodiments of the disclosure.

Figure 11B:
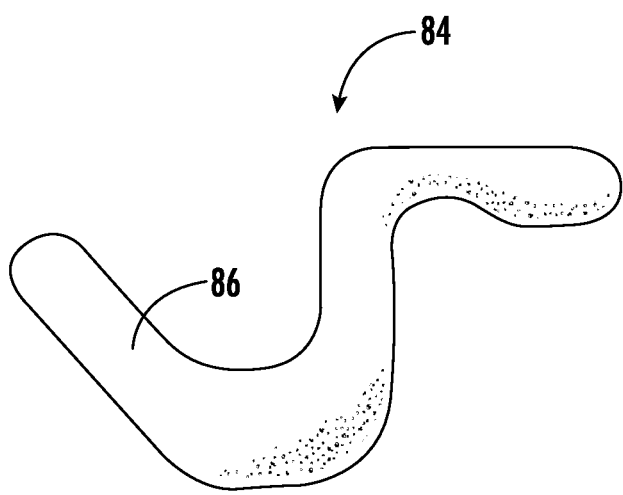

FIG. 11B illustrates a cross-sectional enlarged view of a stop seal for the seal portion of the door frame, in accordance with some embodiments of the disclosure.

Figure 12A:
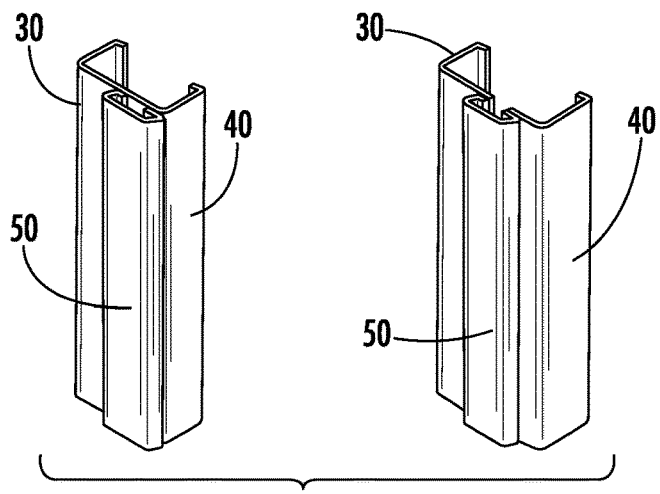

FIG. 12A illustrates perspective front views of one type of door frame in the fully retracted and fully expanded positions, in accordance with some embodiments of the disclosure.

Figure 12B:
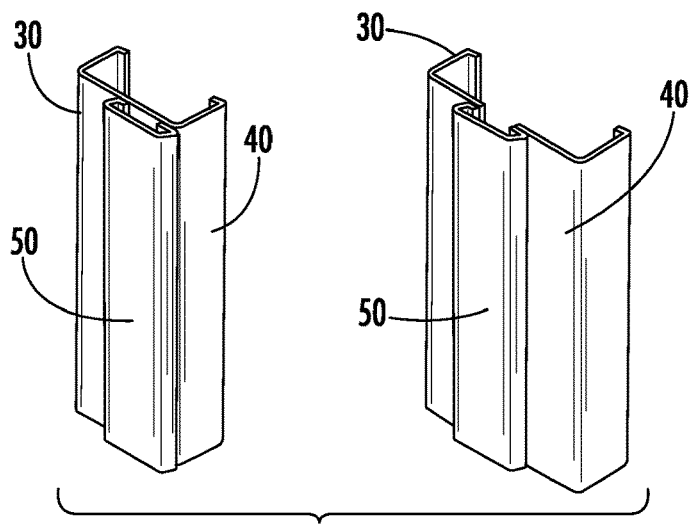

FIG. 12B illustrates perspective front views of one type of door frame in the fully retracted and fully expanded positions, in accordance with some embodiments of the disclosure.

Figure 12C:
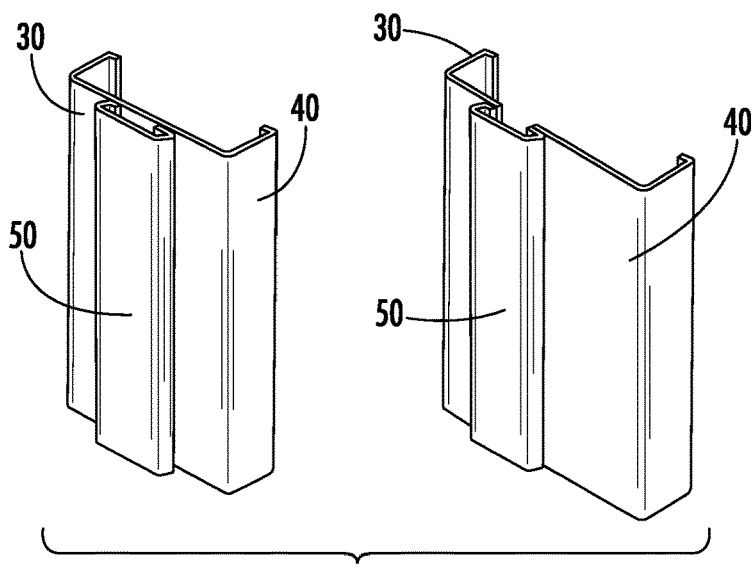

FIG. 12C illustrates perspective front views of one type of door frame in the fully retracted and fully expanded positions, in accordance with some embodiments of the disclosure.

Figure 12D:
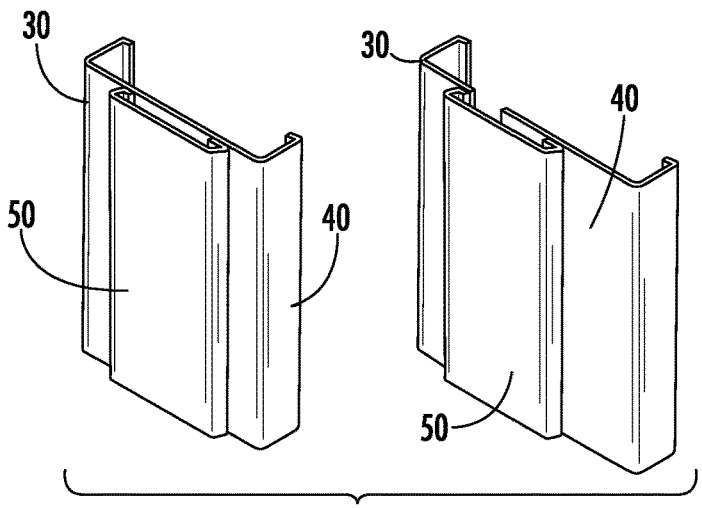

FIG. 12D illustrates perspective front views of one type of door frame in the fully retracted and fully expanded positions, in accordance with some embodiments of the disclosure.

Figure 12E:
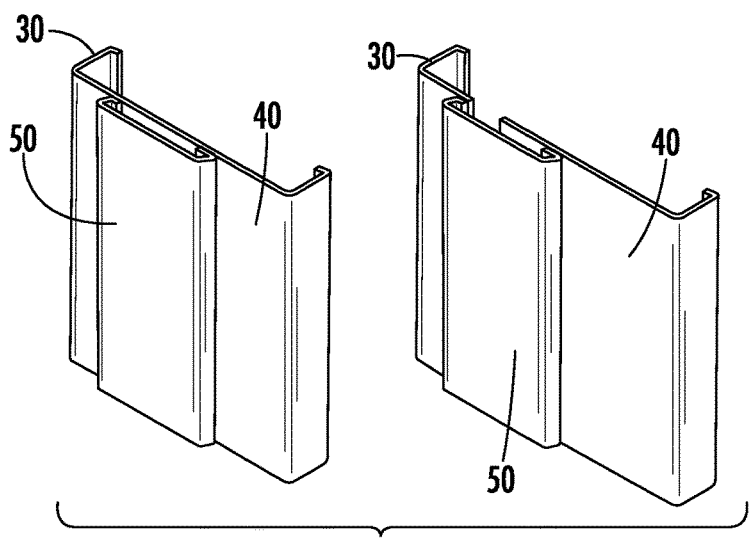

FIG. 12E illustrates perspective front views of one type of door frame in the fully retracted and fully expanded positions, in accordance with some embodiments of the disclosure.

Figure 12F:
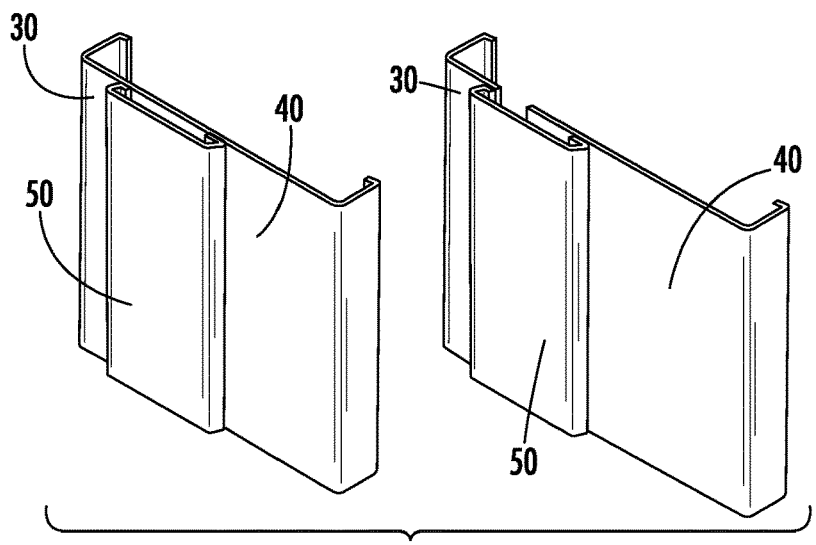

FIG. 12F illustrates perspective front views of one type of door frame in the fully retracted and fully expanded positions, in accordance with some embodiments of the disclosure.

Figure 13:
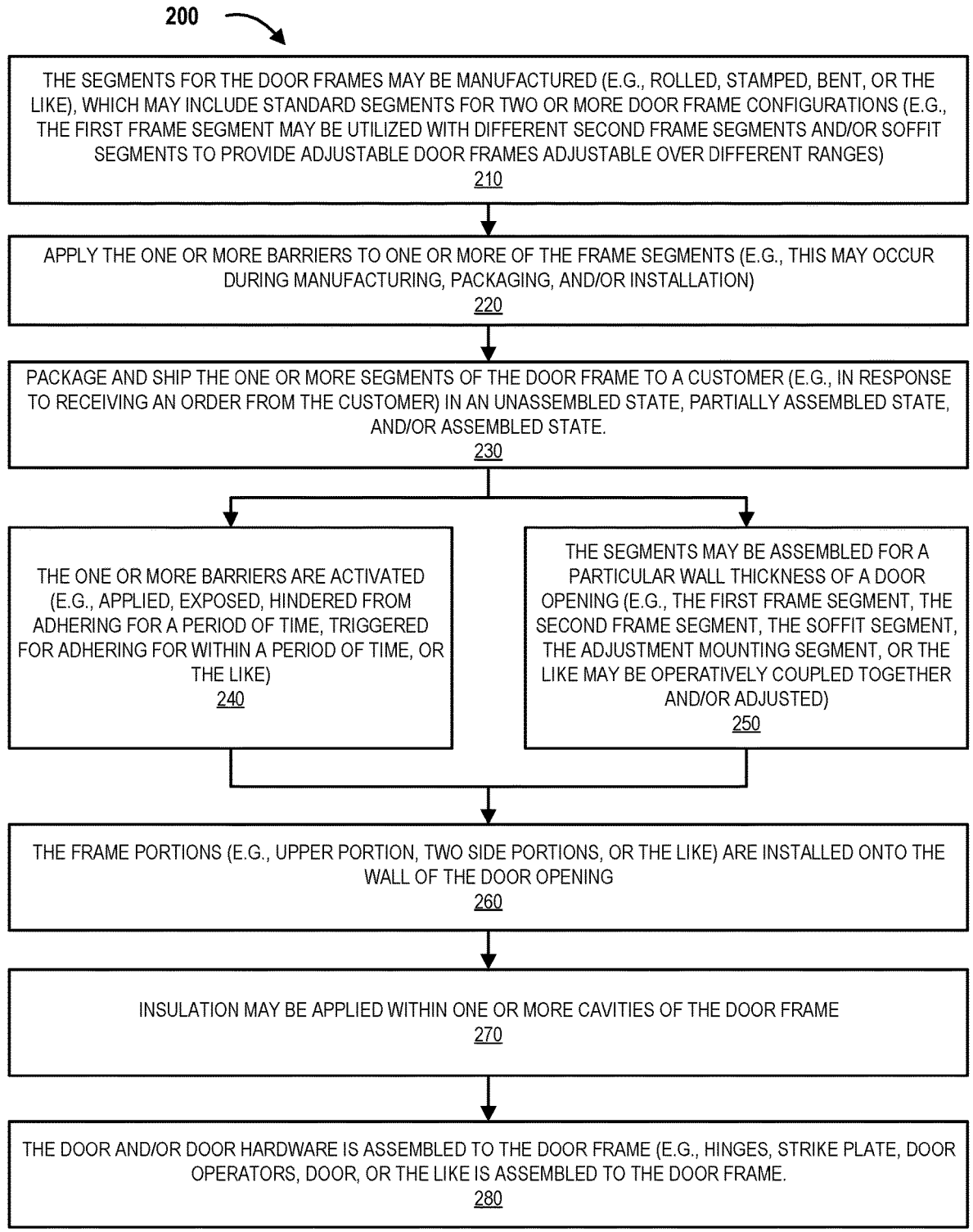

FIG. 13 illustrates a process for manufacturing and installing the adjustable thermal break frame, in accordance with some embodiments of the disclosure.

FIG. 14A illustrates an enlarged view of a door frame and door having shielding, in accordance with some embodiments of the disclosure.

Figure 14B:
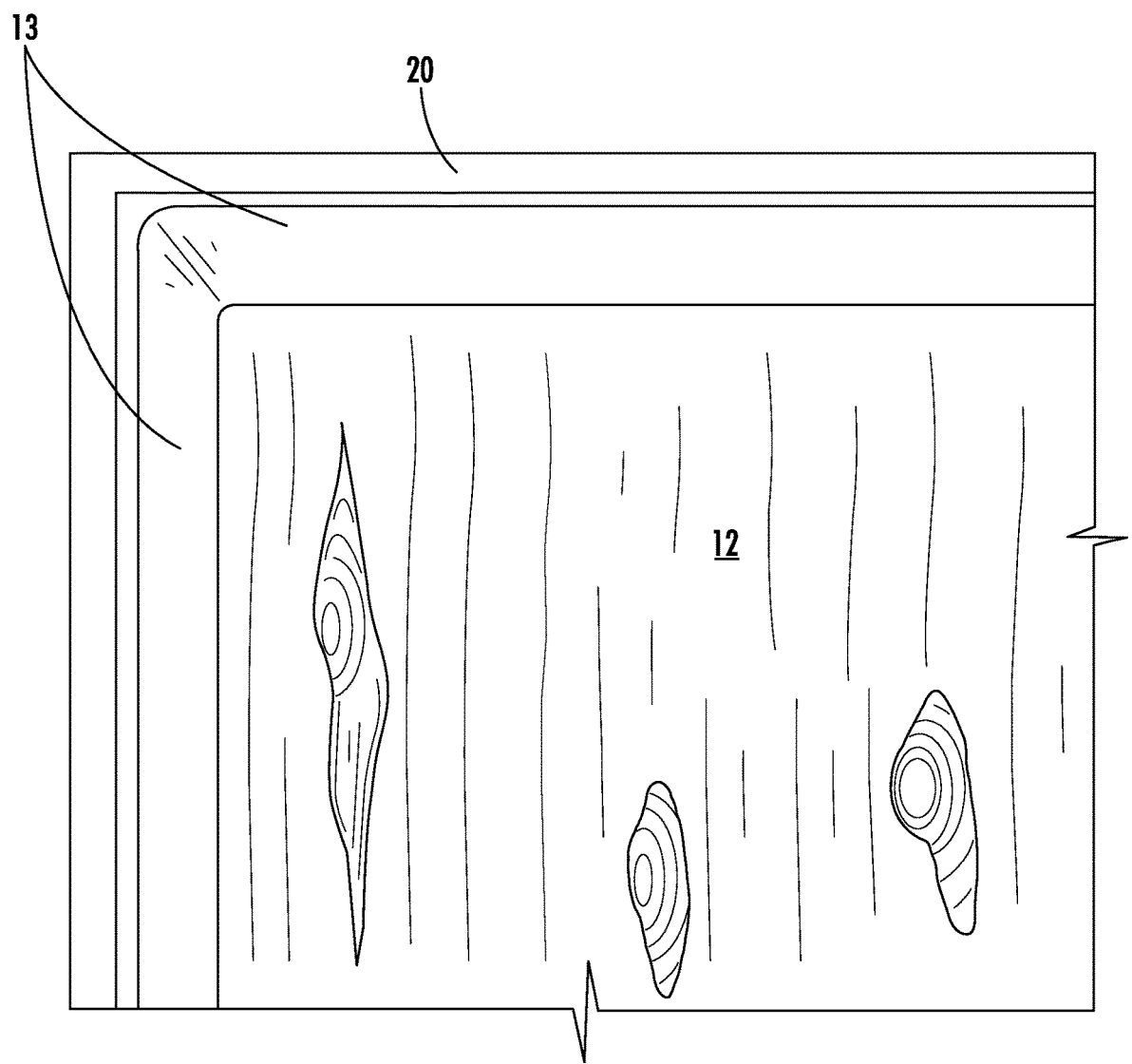
Figure 14C:
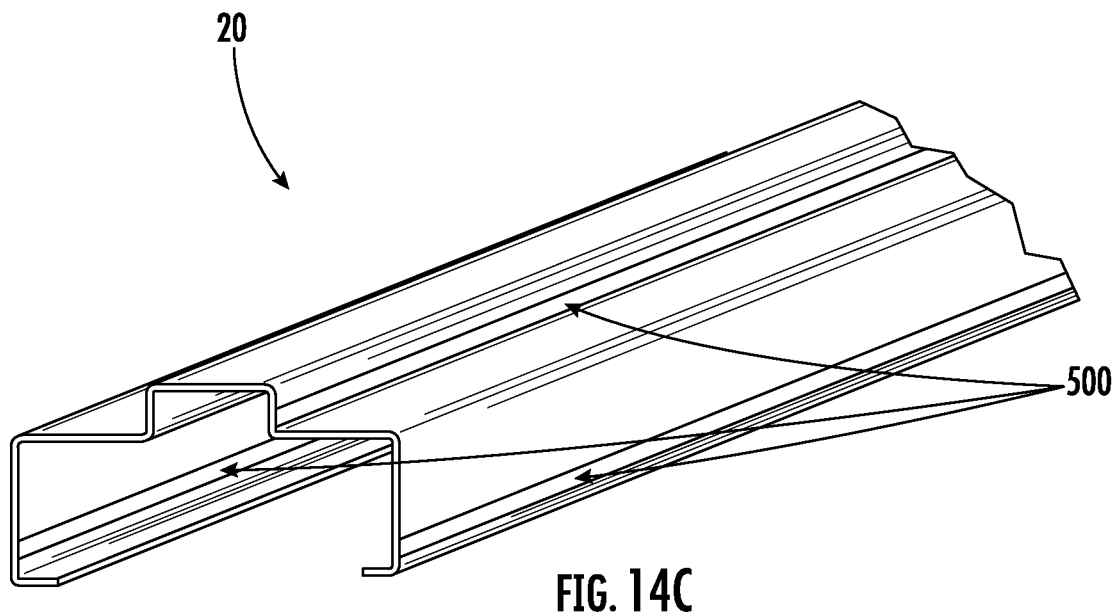

FIG. 14B illustrates another enlarged view of a door frame and door having security features, in accordance with some embodiments of the disclosure FIG. 14C illustrates a portion of a frame with layers of material, in accordance with some embodiments of the disclosure.

Figure 14D:
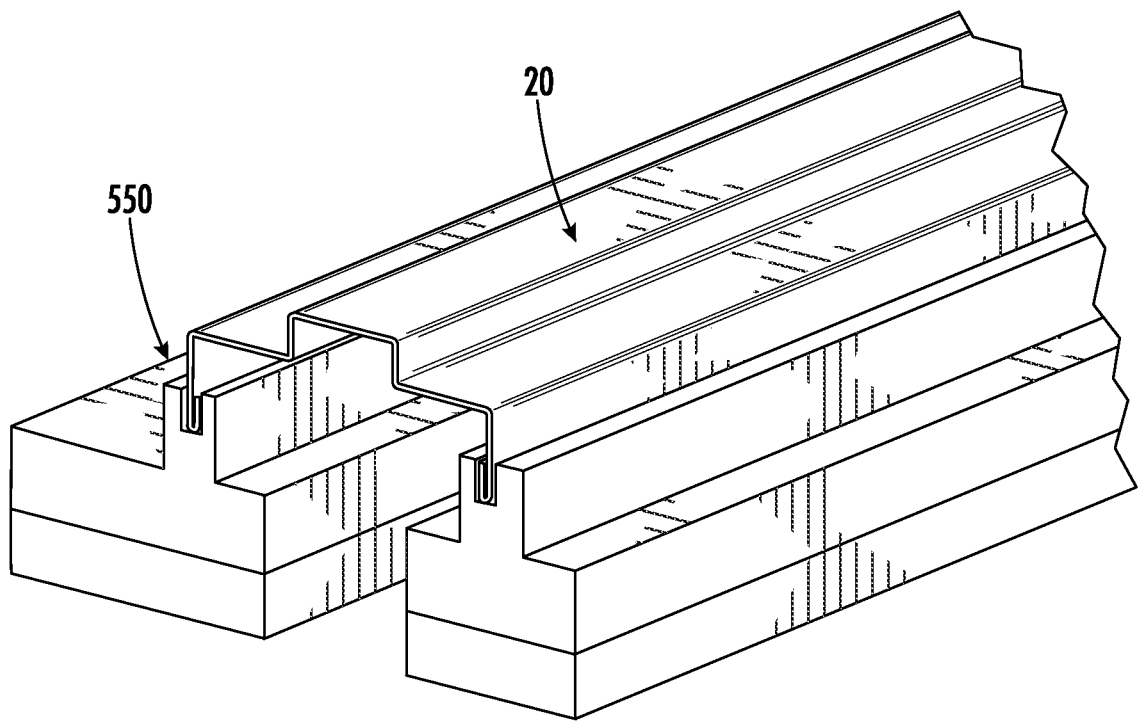

FIG. 14D illustrates an apparatus for applying layers of material to a frame, in accordance with some embodiments of the disclosure.

Figure 15A:
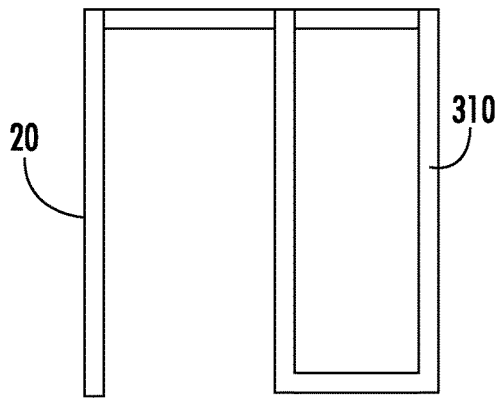

FIG. 15A illustrates a front view of a door frame and sidelight frame, in accordance with some embodiments of the disclosure.

Figure 15B:
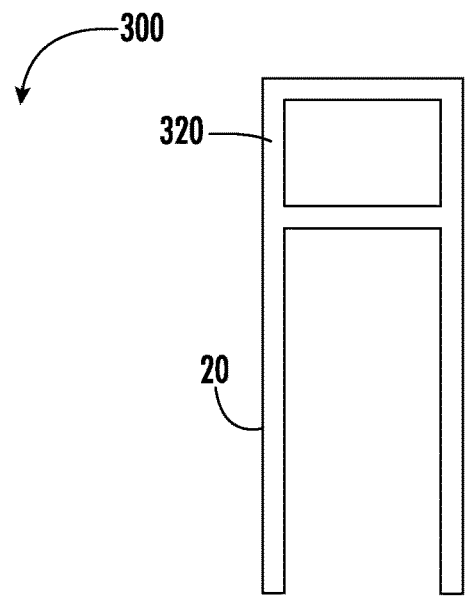

FIG. 15B illustrate a door frame and transom frame, in accordance with some embodiments of the disclosure.

Figure 15C:
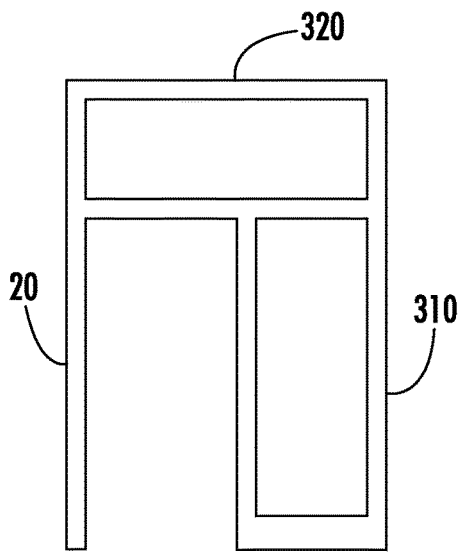

FIG. 15C illustrates a door frame, a sidelight frame, and a transom frame, in accordance with some embodiments of the disclosure.

Figure 15D:
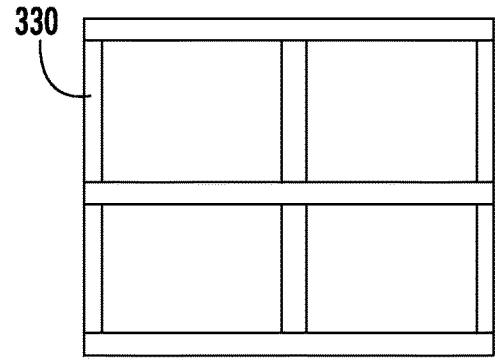

FIG. 15D illustrates a window frame, in accordance with some embodiments of the disclosure.

Figure 15E:
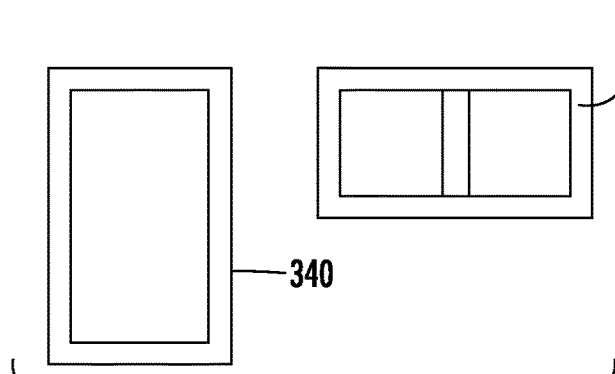

FIG. 15E illustrates borrowed light frames, in accordance with some embodiments of the disclosure.

DETAILED DESCRIPTION

The following detailed description teaches specific example embodiments of the invention; however, other embodiments of the invention do not depart from the scope of the present invention. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including" when used herein, specify the presence of stated features, steps, operations, elements, and/or components, but do not preclude the presence or addition of one or more other features, steps, operations, elements, components, and/or groups thereof.

Embodiments of the invention will be described with respect to FIGS. 1A through 12F illustrating a door frame 20 (e.g., otherwise described as an adjustable door frame, an adjustable thermal brake frame, or the like). As illustrated in FIG. 1A, the door frame 20 may comprise three portions including an upper portion 24 disposed adjacent an upper end of a door opening, and two side portions 26, 28 disposed along either edge of the door opening, with one side portion 26 being on the hinge side of the door 12, and the opposite side portion 28 being on the latch side of the door 12. Each portion 24, 26, 28 may be made up of two or more elongated frame segments (e.g., a pair of elongated frame segments 30, 40) of sufficient length to fit the door opening and door 12. The frame segments 30, 40 are assembled around the open edges of wall 10. A first frame segment 30 may be disposed on the outer side of the door opening (e.g., the side of wall 10 that is normally outside of the door 12), and a second frame segment 40 may be disposed on the inner side of the door opening (e.g., the side of the wall 10 that is normally enclosed by the door 12). However, in some embodiments the first frame segment 30 may be disposed on the inner side of the door opening and the second frame segment 40 may be disposed on the outer side of the door opening. The door frame portions 24, 26, 28 may be secured to each other and/or an adjoining structure by frame connectors 25 (e.g., clips, tabs, fasteners, or the like). As further illustrated in FIG. 1A, a door 12 may be hung otherwise conventionally within the door opening by hinges 90 secured by fasteners 92 through openings to hinge reinforcements 27 in one (for a single door) or both (for double doors) of frame side portions 26, 28 so that the door face contacts stop flanges 33, 54, 56, or the like as will be described herein. The door 12 may be any type of conventional door, any customized door, or the like.

As will be described in further detail herein, the segments (e.g. the first frame segment 30, the second frame segment 40, or other like segments) are adjustable with respect to each other and are of sufficient length to extend around the door opening (e.g., the thickness of the door opening, such as the wall 10 or other component). In some embodiments, a third segment (e.g., a soffit segment 50, or the like) may be utilized to cover at least a portion of the first frame segment 30 and the second frame segment 40. A fourth segment (e.g., an adjustment mounting segment 60) may be operatively coupled to the first frame segment 30 or the second frame segment 40 to aid in allowing the adjustment between the segments and/or mounting of the segments together, as will be discussed in further detail herein. Moreover, the first frame segment 30 and the second frame segment 40 may have one or more thermal barriers 100 (e.g., tape, adhesive, sealant, caulk, or the like) located between portions of one or more of the segments 30, 40, 50, 60, or other security features as will be discussed in further detail herein. The first frame segment 30 may be adjusted with respect to the second frame segment 40, and in some embodiments the soffit segment 50 may be operatively coupled to a portion of the first frame segment 30 and the second frame segment 40. The adjustment of the segments may be made before or after the one or more barriers 100 (e.g., thermal, air infiltration/exfiltration, or the like) are activated (e.g., installed, applied, exposed, triggered, or the like). The segments 30, 40, 50, 60 may be operatively coupled through the use of one or more segment connectors 70 (e.g., clips, tabs, fasteners, and/or the like).

The segments 30, 40, 50, 60, the adjustability of the segments 30, 40, 50, and the one or more barriers 100 (e.g., thermal, air infiltration/exfiltration, or the like) will be described in further detail with respect to FIGS. 2 through 12F. It should be understood that the segments 30, 40, 50, 60 may have any type of configuration (e.g., number, angles, lengths, thicknesses, or the like) for the flanges (e.g., mounting, stop, jamb, leg, face, and/or other like flanges). However, in some embodiments specific flange configurations will be used, as described in further detail with respect to FIGS. 2 through 4. As illustrated, the first frame segment 30 may comprise a first molding flange 31 that may form a door opening molding (e.g., outer or inner door opening molding), which may be parallel to a wall 10 (e.g., inner or outer wall 10) and spaced therefrom at one end by the first leg flange 35 (e.g., perpendicular to the first molding flange 31, or the like). A first jamb flange 32 extends adjacent to the other end of the first molding flange 31 (e.g., perpendicular to the first molding flange 31, or the like). A first stop flange 33 may extend adjacent to the other end of the first jamb flange 32 (e.g., perpendicular to the first jamb flange 32, or the like), which may have extending therefrom a first face flange 34 (e.g., perpendicular to the first stop flange 33).

The second frame segment 40 has a second molding flange 41, which may be parallel to a wall 10 (e.g., inner or outer wall 10) and spaced therefrom at one end by a second leg flange 45 (e.g., perpendicular to the second molding flange 41, or the like). A second jamb flange 42 may extend adjacent to the other end of the second molding flange 41 (e.g., perpendicular to the second molding flange 41, or the like). An adjustment system 140 may be utilized to operatively couple the first frame segment 30 to the second frame segment 40. In some embodiments, the adjustment system 140 may comprise one or more adjustment members 44. For example, as illustrated in FIGS. 2 through 4, the one or more adjustment members 44 (e.g., an adjustment tab, or the like) may be operatively coupled to the second jamb flange 42 (e.g., may extend from the second jamb flange 42), such as upper adjustment members 46, lower adjustment members 48, additional adjustment members, or the like. The one or more adjustment members 44 may be utilized for operative coupling with the first frame segment 30 and/or the soffit frame segment 50, as will be described in further detail herein. It should be understood that while the one or more adjustment members 44 may be illustrated as extending from the second frame segment 40, the one or more adjustment members 44 may additionally, or alternatively, extend from the first frame segment 30. Furthermore, while the one or more adjustment members 44 are illustrated as tabs that extend from second jamb flange 42, the adjustment members 44 may be an extension of the second jamb flange 42 that runs the entire length (L) of the second frame segment 40. In other embodiments the one or more adjustment members 44 may be formed separately from, and later operatively coupled to, the second jamb flange 42 or another flange of the first frame segment 30 and/or the second frame segment 40.

As illustrated in FIGS. 2 through 4, the third frame segment 50 may be a soffit frame segment 50 that acts as a cover for the first frame segment 30 and/or the second frame segment 40, and/or as additional structural support for the first frame segment 30 and/or the second frame segment 40. The soffit frame segment 50 may comprise a soffit face flange 52 from which a first soffit stop flange 54 extends from one end (e.g., extends perpendicularly from the soffit face flange 52, or the like), and a second soffit stop flange 56 extends from the opposite end of the soffit face flange 52 (e.g., extends perpendicularly from the soffit face flange 52, or the like). The soffit frame segment 50 may further comprise a soffit mounting flange 58 that extends from the second soffit stop flange 56 (e.g., extends perpendicularly from the second soffit stop flange 56, or the like).

It should be understood in some embodiments of the invention, an adjustment mounting segment 60 may be operatively coupled to the first frame segment 30 (e.g., integrally operatively coupled through additional bent flanges, formed separately and operatively coupled to the first frame segment 30, such as through weld(s), operatively coupled with connectors, or the like). The adjustment mounting segment 60 may serve as the mounting location for the one or more adjustment members 44 of the second frame segment 40. Moreover, the adjustment mounting segment 60 may further serve as a reinforcement member for the first frame segment 30 and/or the soffit frame segment 50 (e.g., the first stop flange 33, first face flange 34, first soffit stop flange 54, soffit face flange 52, or the like). The adjustment mounting segment 60 may have an adjustment stop flange 62 and an adjustment face flange 64 extending therefrom (e.g., perpendicular to the adjustment stop flange 62, or the like). The adjustment mounting segment 60 may further have an adjustment mounting flange 66 extending from the adjustment stop flange 62 (e.g., perpendicular to the adjustment stop flange 62, or the like) that is used for mounting of the second frame segment 40. The mounting segment 60 may be a portion of the first frame segment 30, such as additional flanges that extend from and/or are folded back upon the first stop flange 33 and/or the first face flange 34. However, as illustrated in FIGS. 2 through 4, the adjustment mounting segment 60 may be a separate segment that is operatively coupled to the first frame segment 30, such as to the first stop flange 33 and/or the first face flange 34 of the first frame segment 30.

Between the corresponding faces, stops, jambs, or the like of the segments 30, 40, 50, 60 may be one or more barriers 100 (e.g., thermal insulative barriers, air infiltration/exfiltration barriers, other barriers that provide security features, or the like), such as a tape, layer, strip, sealant, glue, adhesive, epoxy, caulk, coating, film, fabric, and/or the like. In some embodiments the thermal barrier 100 may comprise one or more layers of material (e.g., including one or more layers of adhesive on one or both opposing sides of the thermal barrier layer, or the like). For example, a double sided adhesive tape may be used, which is made from a strip of plastic or other polymeric material, such as a compression-type closed cell polyurethane foam or other weather stripping, which has applied on both surfaces a pressure-sensitive adhesive. An example is Norton V2845 double-sided tape. The tape may have one or more tape covers that may be peeled off to expose an adhesive layer. A thermal barrier 100 may be located between a portion of the first frame segment 30 and the second frame segment 40, between the first frame segment and the soffit segment 50, between the second frame segment 40 and soffit segment 50, between the first frame segment 40 and the adjustment mounting segment 60, or other like locations between these segments and/or additional segments. For example, a stop thermal barrier 102 may be located between a first stop flange 33 and a first soffit stop flange 54. In other examples, a soffit thermal barrier 104 may be located between a soffit face flange 52 and a first face flange 34. It should be understood that the stop thermal barrier 102 and the soffit thermal barrier 104 may comprise a single thermal barrier. For example, the thermal barrier may be applied from a single strip in an "L" shape. Furthermore, as illustrated in FIG. 3, a first mounting thermal barrier 106 may be located between the first jamb flange 32 and/or the adjustment mounting flange 66 and the second jamb flange 42 and/or the one or more adjustment members 44. Moreover, a second mounting thermal barrier 108 may be located between the second jamb flange 42 and the soffit mounting flange 58. It should be understood that in some embodiments, the barrier 100 (e.g., thermal, air infiltration/exfiltration, or other protective barrier) may be a liquid or alternate material that is applied to the frame surfaces, legs and members to cover the frame substrate without use of a solid seal or in addition to a solid seal.

The one or more barriers 100 (e.g., thermal, air infiltration/exfiltration, other barriers, hybrid barriers, or the like) may provide structural connection between the frame segments 30, 40, 50, 60 (e.g., the first frame segment 30, the second frame segment 40, the soffit frame segment 50, the adjustment mounting segment 60, and/or other segments), forming a bonded thermal break that minimizes thermal conduction between the frame segments (e.g., in particular, inner and outer frame segments that are subject to exposure to different temperatures). Moreover, the one or more segment connectors 70, such as the fasteners, are used at the location of the one or more thermal barriers 100, such that that bridging of metal to conduct heat from a warmer frame segment on one side of the door opening to a colder frame segment on the other side of the door opening is minimized and/or broken by the one or more thermal barriers 100.

The one or more thermal barriers 100 between the door frame segments 30, 40, 50, 60 reduces thermal conductivity between the door frame segments 30, 40, 50, 60. The door frame 20 of the present invention is most advantageously used on an exterior wall of a building, where there are extremes in temperature between the building exterior and interior. Alternatively, it may also be used on interior walls where the door 12 encloses a room from a hallway, between different rooms, or the like. Moreover, the adjustably of the door frame 20 is advantageously used where wall tolerances are off, where a building has different sized walls (e.g., a uniform adjustable door frame may be ordered that can be used on any wall thickness within a particular range), to account inaccurate wall measurements, or the like.

FIGS. 5 through 7 illustrates embodiments of the adjustable door frame 20 in which the door frame 20 may be installed in the door opening before assembling the third frame 50 portion. As illustrated in FIGS. 5 through 7, the first segment 30, the second segment 40, the third segment 50, and/or an adjustment mounting segment 60 may have the same flanges, such as the faces, stops, jambs, or the like as described with respect to FIGS. 2 through 4. However, as illustrated in FIGS. 5 through 7, the one or more adjustment members 44 may be operatively coupled together from the outside of the door frame 20 as the first segment 30 and the second segment are being installed around a wall of a door opening, as will be described in further detail herein.

The adjustment system 140 may comprise the one or more adjustments members 44 previously discussed herein. As such, the one or more adjustment members 44 may comprise a first adjustment member 142 that may be operatively coupled to a second adjustment member 144. The first adjustment member 142 may comprise an adjustment tab 146 having a tab aperture 148 therethrough (e.g., a slotted aperture, or the like). The second adjustment member 144 may comprise an adjustment receptacle 150 that may receive the adjustment tab 146. The adjustment receptacle 150 may have one or more receptacle flanges 162 that are operatively coupled to the first segment 30 (e.g., welded to the inside surface of the first jamb flange 32, or the like) and one or more receptacle hoods 164 that are offset from the one or more receptacle flanges. The flanges 162 and hood 164 form a receptacle cavity 166 that is configured to receive the adjustment tab 146, such as slidably receive the adjustment tab 146 to allow for a width adjustment of the door frame 20 (e.g., changing the position of the first segment 30 with respect to the second segment 40). The adjustment system 140 may further aid in restricting rotational movement of the first segment 30 with respect to the second segment 40 (e.g., due to the receipt of the adjustment tab 146 within the adjustment receptacle 150).

In order to facilitate the one or more adjustment members 44 (e.g., assembly of the first adjustment member 142 to the second adjustment member 144), as illustrated in FIG. 6, the first segment 30 may have one or more access apertures 38 that allow a user to use one or more of the segment connectors 70 (e.g., a width adjustment connector 72) to operatively couple the first segment 30 to the second segment 40. As illustrated in the figures, one or more segment connectors 70 may be used to operatively couple the first segment 30 to the second segment 40 for preventing further adjustment of the width of the door frame 20. For example, one or more segment connectors 70 may be utilized (e.g., inserted through, accessed if the connectors 70 are self-contained, or the like) through one or more access apertures 38 in the first segment 30 to operatively couple the first adjustment member 142 (e.g., the adjustment tab 146) to the second adjustment member 144 (e.g., the receptacle hood 164 of the adjustment receptacle 150). As illustrated in the figures, since the first segment 30 can be operatively coupled to the second segment 40 from the outside of the door frame 20, then the door frame 20 may be assembled to a wall of the door opening without having to first set the width of the adjustable door frame 20.

As further illustrated in FIGS. 6 and 7, the third segment 50 of the door frame may then be operatively coupled to the first segment 30 and the second segment 40 of the door frame 20. In some embodiment the third segment 50 may be operatively coupled to the first segment 30 and/or the second segment 40 through the use of one or more thermal barriers 100. The one or more thermal barriers (e.g., strips, layers, liquid coatings, or the like) may be applied during installation, pre-installed to the first segment 20, second segment 40, third segment 50, and/or the adjustment members 44 as previously described herein. As illustrated in FIG. 7, the one or more thermal barriers 100 may comprise a stop thermal barrier 102 may be located between a first stop flange 33 and a first soffit stop flange 54. In other examples, one or more soffit thermal barriers 104 may be located between a soffit face flange 52 and a first face flange 34. It should be understood that the stop thermal barrier 102 and the one or more soffit thermal barriers 104 may comprise a single thermal barrier. For example, the thermal barrier may be applied from a single strip in an "L" shape. Furthermore, as illustrated in FIG. 7, a first mounting thermal barrier 106 may be located between the adjustment members 44 (e.g., the first adjustment member 142 and the second adjustment member 144. Moreover, a second mounting thermal barrier 108 may be located between the second jamb flange 42 and the soffit mounting flange 58. It should be understood that the third segment 50 may be installed using only the thermal barriers 100; however, in some embodiments a soffit connector 74 may be used to operatively coupled the second segment 40 to the soffit segment 50. In the illustrated embodiment, after the first segment 30 and the second segment are operatively coupled to together as previously discussed, the assembled first segment 30 and/or second segment 40 may operatively coupled to the third segment 50 through the use of the soffit connector 74 (e.g., after the first segment 30 and the second segment 40 are removed from the wall of the door opening, or the like).

FIGS. 8 through 10 illustrate embodiments of the invention in which the door frame 20 may be installed in the door opening using multiple adjustment members 44. As illustrated in FIGS. 8 through 10, the first segment 30, the second segment 40, and/or the third segment 50 may have the same faces, stops, jambs, or the like as described with respect to FIGS. 2 through 7. However, in some embodiments, the second segment 40 may further comprise a second stop flange 43 extending from (e.g., perpendicularly) the second jamb flange 42. Moreover, the first frame segment 30 may have an alternate adjustment system 140. For example, as illustrated in the figures the adjustment system 140 may comprise one or more first adjustment members 170 and/or the second frame segment 40 may have one or more second adjustment members 180. The one or more first adjustment members 170 (upper and lower first adjustment members 172, 174) and/or the one or more second adjustment members 180 (e.g., upper and lower second adjustment members 180) may allow for adjustment between the first frame segment 30 and the second frame segment 40 in order to adjust the width of the door frame 20 for extension around the thickness of the door opening of the door 12.

In some embodiments, the one or more first adjustment members 170 may extend from the first frame segment 30, such as from the first jamb flange 32 (e.g., welded, fastened, or the like to the inner surface of the first jamb flange 32). In some embodiments, one or more second adjustment members 180 may be operatively coupled to the second frame segment 40. The one or more second adjustment members 180 may extend from the second frame segment 40, such as from the second jamb flange 42 (e.g., welded, fastened, or the like to the inner surface of the first jamb flange 32). Moreover, the one or more first adjustment members 170 are operatively coupled to the one or more second adjustment members 180 (e.g., slidably operatively coupled) to adjust the width of the door frame 20. In the illustrated embodiment the one or more first adjustment members 170 and/or the one or more second adjustment members 170 may have one or more ribs 176, 186 to facilitate sliding of the of the members 170, 180 with respect to each other. Furthermore, the first adjustment members 170 and/or the second adjustment members 180 may have any shape and/or size (e.g., length, width, thickness, or the like) and may be operatively coupled on the same or different planes of the first segment 30 and/or the second segment 40. In the illustrated embodiment, the pair of first adjustment members 170 may be operatively coupled to the first segment 30 on different planes, while the pair of second adjustment members 180 may be operatively coupled to the second segment 40 on the opposite planes. As such, in the illustrated embodiment the first upper adjustment member 172 sits under the second upper adjustment member 182, while the first lower adjustment member 174 sits over the second lower adjustment member 184 (e.g., when viewed from the inside of the door frame 20). However, it should be understood that any number of adjustment members 170, 180 may be used in any configuration (e.g., overlapping, position, offset, not offset, or the like). As such, the adjustment members 170, 180 may slide with respect to each other.

Moreover, as further illustrated in FIG. 10, the third segment 50 of the door frame may then be operatively coupled to the first segment 30 and the second segment 40 of the door frame 20. In some embodiment the third segment 50 may be operatively coupled to the first segment 30 and/or the second segment 40 through the use of one or more thermal barriers 100. The one or more thermal barriers 100 may be applied during installation, pre-installed to the first segment 20, second segment 40, third segment 50, and/or the adjustment members 44 as previously described herein. As illustrated in FIG. 10, the one or more thermal barriers 100 may comprise a stop thermal barrier 102 may be located between a first stop flange 33 and a first soffit stop flange 54. In other examples, one or more soffit thermal barriers 104 may be located between a soffit face flange 52 and a first face flange 34. It should be understood that the stop thermal barrier 102 and the one or more soffit thermal barriers 104 may comprise a single thermal barrier. For example, the thermal barrier may be applied from a single strip in an "L" shape. In some embodiments the adjustment members 170, 180 may have a thermal barriers 100 located between the adjustment members 170, 180. For example, as illustrated in FIG. 10, a first mounting thermal barrier 106 may be located between the adjustment members 44 (e.g., the first upper adjustment member 172 and the second upper adjustment member 182 and the first lower adjustment member 174 and the second lower adjustment member 184). Moreover, a second mounting thermal barrier 108 may be located between the second jamb flange 42 and the soffit mounting flange 58. It should be understood that the third segment 50 may be installed using only the thermal barriers 100; however, in some embodiments a soffit connector 74 may be used to operatively coupled the second segment 40 to the soffit segment 50.

In alternate embodiments the adjustment members 170, 180 may have apertures through which one or more segment connectors 70 (e.g., clips, tabs, fasteners, and/or the like) and/or through the use of the one or more first adjustment members 50 and/or the second adjustment members 60. In some embodiments the adjustment members 170, 180 may be formed in an L-shape. In some embodiments, the one or more adjustment members 170, 180 may comprise one or more first apertures (not illustrated) and/or one or more second apertures (not illustrated) that are used to operatively couple the adjustment members 170, 180 to each other.

It should be understood that embodiments of the present invention may be utilized for any type of door 12 and/or door system 1. In some embodiments, the door 12 and/or door frame 20 may be insulated to aid in reducing heat transfer, sound, or the like. As such, in some embodiments, a cavity formed between the door frame 20 and the wall 10 may be filled with material, coatings, layers, or the like that provide conductive, non-conductive, sound transmission class (STC) ratings, EMC shielding, fire resistive, insulative, or the like properties. With respect to the insulation material, it may be expandable foam, such as BASF 21B density polyurethane expanding foam using P50341 resin and Honeywell HFO blowing agent. The foam when cured acts to provide thermal insulation through the thickness of the door frame 20. For example, flowable foam may be injected into the cavity of the frame portions formed by the frame segments 30, 40, 50, 60. The injection may be made through foam slots in the door frame segments 30, 40, 50, 60. The flowable foam may be a foam material that expands upon contact with the atmospheric air or alternately a two-part foam that expands upon mixing the two parts together. The flowable foam then hardens and is bonded to the inside surfaces of the frame segments 30, 40, 50, 60. The foam acts both as an insulation material and bonds to the door segments 30, 40, 50, 60. Thus, the present invention may provide an insulated door frame 20 that improves the structural integrity, thermally efficiency, or the like. It should be understood that the thermal barrier materials may also provide barriers to prevent air infiltration and exfiltration through the frame and door opening, thus reducing the energy loss.

Moreover, in some embodiments the door 12 and/or door frame 20 may protect against forced entry (FE) and/or bullet resistant (BR) (otherwise described as FEBR doors openings) by using ballistic resistant materials such as steel armor, composite BR fiberglass, Kevlar, BR composites, woven layers (as will be discussed in further detail herein), or other like materials as part of the frame core component, as will be described in further detail herein.

As illustrated in FIGS. 11A and 11B, in some embodiments the first frame segment 30, the second frame segment 40, the soffit frame segment 50, the adjustment mounting segment 60, and/or other segments may include a seal cavity 80 (e.g., a kerf seal cavity, or the like). For example, the kerf seal cavity 82 may be formed from portions of a jamb flange (e.g., a first jamb flange 32, a second jamb flange 42, or the like) and/or a stop flange (e.g., a first stop flange 33, a first soffit stop flange 54, a second soffit stop flange 56, and/or the like). As such, the seal cavity 80 may be sized to include a seal 84, such as a kerf seal 86, as illustrated in FIGS. 11A and 11B. Different types of Kerf seals may utilize different types of material and/or designs in order to provide thermal, (STC), weather, fire, or the like protection, as described herein.

FIG. 13 illustrates a process for manufacturing and/or installing the adjustable door frame 20, including in some embodiments the thermal barrier 100, as described herein. In some embodiments of the invention, one or more of the door frame segments 30, 40, 50, 60, may be a standard size and configuration. For example, in the illustrated embodiment the first door frame segment 30 may be a standard size that can be used for any of the door frames 20. As such, while the first door frame segment 30 may be a standard size, and may be adjustable with respect to the second door frame segment 40, different second door frame segments 40 (and potentially, soffit segments 50, or the like) may be used to allow for different ranges of adjustment for different sizes of door opening thicknesses. For example, as illustrated in FIGS. 12A through 12F, each of the door frames 20 may have the same first frame segment 30 (e.g., thus reducing the manufacturing costs associated with creating different sized adjustable door frames), but there may be 2, 3, 4, 5, 6, 7, 8, 9, 10, or the like different second frame segments 40 and/or soffit segments 50. For example, the second frame segments 40 and/or soffit segments 50 may allow for different ranges of thicknesses for different wall thicknesses. Therefore, as illustrated by block 210 of FIG. 13, the segments for the door frame 20 may be manufactured (e.g., rolled, stamped, bent, or the like). As previously discussed, one or more of the segments 30, 40, 50, 60 may be standard across all door frames 20, and some segments 30, 40, 50, 60 may be limited to one or more of the adjustable door frames 20.

As further illustrated in FIG. 13, the one or more thermal barriers 100 may be applied to at least a portion of the one or more of the segments (e.g., the first frame segment 30, the second frame segment 40, the soffit segment 50, the adjustment frame segment 60, and/or the like). It should be understood that the one or more thermal barriers 100 may be applied during manufacturing, packaging, and/or installing of the segments depending on the type of thermal barrier 100 being used (e.g., tape verses sealant, liquid protective barrier, coating, or the like) and/or the location of the thermal barrier 100. In some embodiments, it should be understood that the one or more thermal barriers 100 may be a tape with adhesives on both sides (e.g., with a cover layer that can be peeled off). As such, the tape may be pre-applied to the first frame segment 30 (e.g., on the first stop flange 33, on the first face flange 34, and/or on the interior of the first jamb flange 32 and/or the adjustment mounting flange 66 of the adjustment mounting segment 60). The tape may also be pre-applied to the second frame segment 40 (e.g., on the second jamb flange 42 and/or the one or more adjustment members 44). The tape may also be pre-applied to the soffit frame segment 60 (e.g., the soffit mounting flange 58, the inner surface of the soffit face flange 52, and/or the inner surface of the first soffit stop flange 54).

As illustrated in block 230, in response to receiving an order from a customer, one or more door frames 20 may be shipped to a customer. It should be understood that the segments 30, 40, 50, 60 may be packaged and shipped uninstalled, partially assembly, and/or assembled (e.g., with the thermal barriers 100 and/or one or more of the segment connectors 70 pre-installed with the segment 30, 40, 50, 60, such that an installer need only make the adjustments to the segments 30, 40, 50, 60 and activate the thermal barriers 100 during installation).

Block 240 further illustrates that on site the installer may have to activate the one or more thermal barriers 100. For example, the installer may have to remove a cover layer from a thermal barrier 100 that comprises of an adhesive tape before assembling at least a portion of the door frame 20. In some embodiments, the installer may have to apply an agent (e.g., acetone, or the like) to the adhesive of the thermal barrier 100 to prevent it from adhering until the segments 30, 40, 50, 60 are assembled together and/or installed on the wall 10 of the door opening. In other embodiments, the installer may have to apply an agent to trigger the adhesive (e.g., water, or the like) so that the adhesive will adhere after the segments are assembled together and/or installed on the wall 10 of the door opening. In other embodiments, the thermal barrier 100 may be in the form of a liquid (e.g., barrier, sealant, or the like) that hardens after application to the door, frame, and/or other like surface.

Block 250 further illustrates that on site the installer may assemble the segments 30, 40, 50, 60 and/or a portion of the segments 30, 40, 50, 60, such as operatively coupling the segments 30, 40, 50, 60 together and/or adjust the segments 30, 40, 50, 60 with respect to each other for the specific wall thickness of the door opening in which the door frame 20 is being installed. For example, the first frame segment 30 may be moved with respect to the second frame segment 40 in order to set a frame width for the door frame 20. The installer may operatively couple the first frame segment 30 to the second frame segment 40 through the use of one or more adjustment connectors 70. For example, a width adjustment connector 72 may be used to operatively couple the one or more adjustment members 44 of the second frame segment 40 to an adjustment mounting flange 66 of the first frame segment 30 in order to set the width of the door frame 20. In some embodiments, as discussed with respect to FIGS. 5 through 7, the frame width for the door frame 20 may be set after the first segment 30 and the second segment 40 are installed around the wall of the door opening. The soffit segment 50 may be placed over a portion of the first frame segment 30 and/or second frame segment 40 that are operatively coupled together with the width adjustment connector 72. The soffit segment 50 may be operatively coupled to the first segment 30 and/or the second segment 40 using only the thermal barriers 100. However, in some embodiments one or more of the adjustment connectors 70 (e.g., a soffit connector 74) may be used to operatively couple the second frame segment 40 to the soffit segment 60. The one or more soffit connectors 74 may be a fastener, and in some embodiments may be a self-drilling and/or tapping fastener (e.g., that can drill through the segments), may be a fastener that is assembled through a pre-drilled and/or tapped aperture, may be a self-contained fastener that is pre-assembled to the segments, and/or may be any other type of fastener.

If the segments are not installed when setting the width of the door frame, as discussed above with respect to FIGS. 5 through 7, block 260 of FIG. 13 illustrates that the frame portions (e.g., the upper portion 24 disposed adjacent an upper end of a door opening, and two side portions 26, 28 disposed along either edge of the door opening) are installed onto the wall 10 of the door opening. The door frame portions 24, 26, 28 may be installed on the upper and side portions of the door opening using frame connectors 25 (e.g., clips, tabs, fasteners, or the like). For example, corner tabs and hanger tabs may be used to secure to the door frame portions 24, 26, 28 to the wall 10 around the door opening and/or to the adjacent door frame portions 24, 26, 28.

Block 270 of FIG. 13 illustrates that insulation may be applied within one or more cavities of the door frame 20. The insulation may provide additional thermal protection between the inner side and outer side of the door frame 20. Additionally, or alternatively, the cavity formed between the door frame 20 and the wall 10 may be filled with material that provides fire resistance, EMC shielding, gamma shielding, and/or other protective properties, such as a RockWool, concrete, fiberglass, polystyrenes, honeycomb, hybrid layers, compound materials, curable and hardenable material, or the like. Alternatively, forced entry (FE) and/or ballistic resistant (BR) material may be provided within the door frame 20 before assembly within the door opening and/or after assembly of the door frame 20 with the door opening.

FIG. 13 further illustrates in block 280, that the door 12 and/or door hardware are assembled to the door frame 20. For example, hinges, a strike plate, door operators, the door, or the like are assembled to the door frame 20 and/or door 12.

The adjustable door frame 20, with or without the thermal breaks, provides improvements over traditional static door frames (e.g., non-adjustable door frame) because the adjustable door frame 20 can be used to account for walls within a building that may be of different sizes, different wall conditions, varying wall thickness, or the like. For example, walls within a building may have different thicknesses due to human error (e.g., installing supports incorrectly, making incorrect measurements), using drywall having different thicknesses (or otherwise applying wall materials having different thicknesses), the building may be older and has had different renovations in the past using different materials, tolerance stack-ups of different components, or the like. As such, buildings may require different door frames specifically sized to accommodate each specific opening in a wall. Consequently, the adjustable door frames 20 of the present invention may be used to account for the different wall conditions within a building without having to use different door frames for different wall conditions (e.g., typical door frames that are fixed in width and jamb depth with no adjustability features).

In particular embodiments, the door system 1 may be an electromagnetic compatibility (EMC) rated door system (e.g., provides electromagnetic interference (EMI), radio frequency interference (RFI), microwave, or the like shielding). The EMC shielding 190 is used to restrict (e.g., reduce, eliminate, or the like) the passing of radio waves, electromagnetic fields, and electrostatic fields outside of the room. EMC materials for EMC shielding may include copper, silver, nickel, aluminum, stainless steel, other types of steel, or other conductive material that would maintain an EMC shielding 190 circuit. Typical shielding materials used for an EMC coating 192, such as a fluid (e.g., liquid, mist, gas, or the like) having a suitable EMC shielding material, typically copper, silver, nickel, aluminum, or the like, or combinations thereof, in the form of particles suspended in the fluid. The EMC coating 192 is applied to a surface, and thereafter dries, to form the EMC shielding 190. Alternatively, the EMC shielding 190 may be an EMC shielding barrier 194 (e.g., fabric-wrapped foam, wire mesh, stamped metal, elastomer, adhesive, glue, resin, epoxy, tape, caulk, or the like) that may be applied to a surface or between surfaces. For example, the EMC shielding barrier 194 may be a copper layer, copper screen, aluminum layer, or the like in order to absorb the radio and magnetic waves.

EMC shielding 190 may be used in many different applications, such as in healthcare rooms (e.g., MRI rooms, or the like), IT/data storage facility protection, government buildings (e.g., embassies, department of state, secret service, or the like), military applications, businesses, labs, emergency call centers, sensitive electronic installations, security facilities, financial centers, RFID scanning locations, or the like. As such, EMI shielding may be used to help avoid computer crashes, protect sensitive electronic equipment, protect storage of confidential information, avoid interference from RF transmitters (e.g., from radio towers, TV broadcast, airport radar, test equipment, or the like), and/or other like applications.

Frequencies at which electromagnetic radiation of energy occurs is at follows: at very low frequencies: −30 kHz, low: 30 to 300 kHz; medium frequencies: 300 to 3,000 kHz; high frequencies: 3 to 30 MHz, very high frequencies: 30 to 300 MHz, ultrahigh frequencies: 300 to 3,000 MHz, superhigh frequencies: 3 to 30 GHz, and extremely high frequencies: 30 to 300 GHz. Typical EMC shielding shields from approximately 70 dB to 140 dB from 10 kHz to 10 GHz; however, it should be understood that EMC shielding may occur within these ranges, overlap these ranges, or fall outside of these ranges. EMC shielding protection can support IEEE 299 levels (occurring at time of filing), or the like. The relative capability of a shield to screen out undesirable electric and magnetic fields and plane waves is the ratio of the signal received without the shield to the signal received inside the shield.

A room that is designed for EMC shielding typically has shielding in the walls 10, doors 12, ceiling, floor, frame 20, or the like. Moreover, the EMC shielding 190 may be utilized, such as by forming a component from EMC material, covering a component in one or more layers (e.g., sheets, or the like) of an EMC material, coating a component with a fluid (e.g., liquid, mist, gas, or the like) that has EMC material particles suspended therein, or the like. It should be understood, breaks in the shielding reduce the effectiveness of the EMC shielding 190. As such, in order to use provide the EMC shielding 190 in the present embodiments the components of the door system 1 incorporate the EMC shielding 190 in one or more ways.

With respect to door frames, as illustrated in FIG. 14A, the adjustable door frame 20 may have EMC shielding 190, such as made from an EMC shielding material (e.g., aluminum, steel, stainless steel, or the like) and/or have a painted EMC shielding coating 192 (e.g., cooper, silver, nickel, or the like, particles, or combinations thereof in a fluid). For example, the segments previously discussed herein, such as the first frame segment 30, the second frame segment 40, or the like, may be made from EMC material and/or covered with a painted EMC shieling coating 192. It should be understood that EMC shielding material may be included on one side or both sides of the segments. Alternatively, or additionally, in order to maintain the effectiveness of the EMI shielding, a EMC shielding barrier 194 (e.g., fabric-wrapped foam, wire mesh, stamped metal, elastomer, adhesive, glue, resin, epoxy, tape, caulk, or the like) may be applied on the segments or between the segments (e.g., single segment, the first segment 30, the second segment 40, or the like) and/or between the frame 20 and the wall 10, or the like. For example, the EMC shielding barrier 194, such as a caulk, may be used on the edges of the frame 20 (e.g., to the wall 10, between segments 30, 40, or the like) to maintain the EMC circuit between the frame 20 and the wall 10. Consequently, not only may the door frame be an adjustable door frame 20, but it can still be used to provide EMC shielding. The EMC, EMI, RFI doors and frames may be made of stainless steel or other alternate component materials and layers that provide enhanced EMC, EMI, and/or RFI shielding effectiveness.

As further illustrated in FIG. 14A, in order to maintain the EMC shielding 190 between the frame 20 and the door 12 in the door system 1, the door 12 may have shielding on the faces (e.g., front face and/or rear face) and/or formed as one or more layers within the door 12, as well as on the edges 13 of the door 10 (e.g., the first side edge, the second side edge, the upper edge and the bottom edge). As illustrated in FIG. 14A, the EMC shielding 190 may be the painted EMC shielding coating 192, however, it could be the EMC shielding barrier 192 described above. Furthermore, one or more seals may be used between the frame 20 and the door 12 that are made of and/or covered in an EMC material in order to improve the EMC shielding circuit between the frame 20 and the door 12.

It should be understood that a floor seal system (not illustrated) may be provided at the bottom edge of the door 12. Similar to the frame portions 24, 26, 28 discussed previously, a seal mount, the bottom seal, and/or a threshold may have EMC shielding 190. As previously discussed, the door 12 may have EMC shielding 190, such as an EMC shielding coating 192 to maintain the EMC circuit between the door 12, bottom seal, and the floor. The threshold may be utilized in order to reduce the gap between a bottom edge of the door 12 and the floor, in order to maintain the EMC circuit between the door 10 and the floor (e.g., EMC shielding 190 on or in the floor). As such, the threshold may be made of or be operatively coupled to an EMC material 190, such as an EMC shielding coating 192 and/or an EMC shielding barrier 194. In some embodiments the threshold may have a threshold seal that is operatively coupled to the threshold (e.g., a channel in the threshold, or the like) which may interact with the bottom edge of the door 12 and/or a bottom seal of the door 12. As such, when the door 12 is closed, the one or more bottom seals may maintain the circuit with the floor and/or the threshold.

It should be understood that the embodiments of the present invention provides improved EMC shielding 190 for the door system 1. However, it should be understood that alternatively, or additionally, the EMC shielding 190 security features of the door system 1 may be replaced by, or may also provide, other security features. For example, the security features may include FEBR protection (e.g., forced entry, ballistic, blast, or the like protection), sound abatement, fire and/or smoke protection, air flow reduction, or the like, and/or combinations of any of the foregoing.

As such, as illustrated in FIG. 14B, in some embodiments, the edges 13 of the door 12 may provide for EMC protection, sound abatement, thermal protection, air restriction, fire rating, or other security features, as described herein. As such, the frame 20 (e.g., on the surface, or the inside of the frame 20) and the door 12 (e.g., faces, or the inside of the door 12) may be covered in one or more layers of material 500 in order to provide the desired security features and/or aesthetic decorative features. For example, the frame 20 and/or the door 12 may have film, paint, coatings, a printed surface (e.g., ink, laser, or the like), fabric, or the like layers of material 500 that provide security features and/or aesthetic decorative features. When the door 12 is in the closed position, the edge 13 may or may not contact or be connected to the interior surface of the frame 20 (e.g., directly or through the use of a barrier, seal, or the like) in order to provide the desired security features. For example, the edge 13 may be free of layers in order to provide the desired security feature and/or may have a specific type of material (e.g., stainless steel, copper, or the like material) in order to provide the desired security features. Moreover, in some embodiments, a sealing member may be used to provide contact between the edge 13 of the door 12 and the interior surface of the frame 20 (e.g., provide the EMC circuit is not broken, provide a thermal break, provide sound abatement, restrict air flow, or the like). As such, the edge 13 of the door and the interior of the frame 20 may or may not contact each other in order to provide the desired security features. In some embodiments, the edges 13 of the door 12 may be made of steel (e.g., stainless steel), which may provide the desired security features (e.g., EMC shielding).

As illustrated in FIGS. 14C and 14D, it should be understood that the security features, may be applied to the frame 20 (e.g., a single unitary frame, the individual frame segments 30, 40, or the like) and/or the door 12 as one or layers of material 500 (e.g., as a liquid or a solid). For example, as illustrated in block 14C, the one or more layers of material 500 (e.g., EMC shielding, thermal, sound abatement, air restriction, or the like layer) may be applied to one or more surfaces of the frame 20, such as the jamb, faces, stops, flanges, or the like depending on the configuration and the desired security features. Moreover, FIG. 14D illustrates one embodiment for applying a material layer that provides the desired security features. As illustrated in FIG. 14C the frame 20 (e.g., the flanges, or the like thereof) may be inserted into a mold 550 that includes a material in liquid form that then hardens, that includes a solid material layer that is extruded over a portion of the frame 20, that applies a solid layer (e.g., tape, film, or the like) onto the frame 20 (e.g., flanges, or the like), or the like, in order to quickly and repeatably create the material layer 500 on the frame 20 that provides the desired security features. It should be understood that the material layer may be formed with or without a mold, by dipping, rolling, spraying, painting, extrusion, liquid or solid applicator, or using another like apparatus for applying the material layer to the frame 20 and/or the door 12.

While the present disclosure is described herein as relating to utilizing an adjustable frame, it should be understood that the security features, as well as the application thereof, may be utilized on any type of frame (e.g., standard, custom, adjustable, kerf, thermal break, decorative, sound abatement, multi-technology, composite, or the like).

In some embodiments, in the event that the door 12 and/or door frame 20 are FEBR door 12 and/or door frames 20, the door frame 20 may include one or more layers of conventional and/or non-conventional ballistic resistant materials. In one embodiment the non-conventional ballistic resistant materials may include (i) a first layer (e.g., a projectile resistant layer) formed from one or more fiber layers, and (ii) one or more additional layers of a sheet (e.g., a porous sheet) and/or one or more additional layers of a fill material. Typically, the first layer may comprise a single fiber layer or a plurality of fiber layers. Each of the one or more fiber layers may comprise, at least in part, a woven or non-woven fibers (e.g., textile fabrics, plastics, or the like).

With respect to fiber layers that are fabric layers, the fabric layers may be manufactured by weaving, knitting or otherwise interlacing certain fibers. In some embodiments, the fabric layers comprise woven (or knitted or interlaced) mineral fibers, such as basalt fibers, in part or in its entirety. In other words, the fabric layer may be formed from a solid mineral, such as basalt. The fabric layer (e.g., the basalt fabric layer, or the like) may comprise a thickness in the range of about 0.005-0.1 inches. In some embodiments, the basalt fabric layer comprises a thickness of about 0.01, 0.015, 0.02, 0.025, 0.030 inches (+/−0.005) and a density of 0.03, 0.04, 0.05, 0.06, 0.07, 0.08, 0.09, 0.10 oz./sq. ft. (+/−0.005). However, it should be understood that the thickness of each of the one or more fabric layers may be any thickness, and/or have any density (e.g., range between, overlap, and/or fall outside of any of the forgoing values). While the fabric layers may be made, at least in part, from basalt, in other embodiments, at least a portion of the fabric layers may be made out of other minerals, metals, alloys, plastics, composites, organic materials, polymers, etc. It should be understood that the use of one or more fabric layers may aid is resisting physical impacts, as will be discussed in further detail herein.

With respect to plastic layers (e.g., non-woven UHMWPE, or the like), the plastic fibers may be formed into a sheet using a bonding material (e.g., resin, or other like bonding material). In some embodiments the plastic layers may comprise plastic fibers that are bonded with resin into a sheet. In other words, the plastic layer may be formed from a solid mineral (e.g., plastic fibers and resin), such as UHMWPE. The plastic layer (e.g., the UHMWPE layer, or the like) may comprise thicknesses that are the same as or similar to the thickness described with respect to the fabric layers discussed above. While the plastic layers may be made, at least in part, from UHMWPE, in other embodiments, at least a portion of the plastic layers may be made out of other types of plastics, or metals, alloys, composites, organic materials, polymers, etc. It should be understood that the use of one or more plastic layers may aid is resisting physical impacts, as will be discussed in further detail herein. The plastic layer (e.g., UHMWPE, or the like) may be 10, 12, 15, 17, 20, or the like times stronger than steel and/or approximately twice as strong as other high strength polymers (e.g., Kevlar), but is also be light enough to float (e.g., approximately 20, 30, 40, 50 or the like lighter than Kevlar).

It is noted that the one or more fiber layers may form the first layer (e.g., a projectile resistant layer). In the instances where multiple fiber layers form the first layer, the fiber layers may all be the same or similar in terms of materials, fiber composition, fiber thickness, weave pattern, non-weave pattern, grain orientation, and other characteristics, or the fiber layers may differ with respect to at least one characteristic. For example, the fiber layers may be orientated in the same direction or may be orientated in different directions. That is, for example, successive fiber layers may be rotated any degree with respect to each other (e.g., in particular, when the fiber layers are woven and may have a pattern). As such, should the fiber layers have a particular pattern, the fiber layers may be orientated such that the fiber pattern does not line up between at least two of the fiber layers. It should be further understood that when a plurality of fiber layers are used for the first layer, the plurality of fiber layers may be operatively coupled to each other in one or more various ways. For example, the fiber layers may be mechanically coupled together, such as through the use of fasteners (e.g., rivets, pins, needles, or the like) that may be inserted through the fiber layers (e.g., in some cases through the weaves of fabric layers, or the like). Additionally, or alternatively, the fiber layers may be operatively coupled together through the use of a compound (e.g., adhesive, glue, resin, epoxy, tape, caulk, or the like) that is applied to one or more opposing surfaces of the fiber layers. In other embodiments, the fiber layers may be operatively coupled together by sandwiching the fiber layers between other layers that are operatively coupled together, by placing the fiber layers within a shell, and/or by bounding the fiber layers with a string, ribbon, mesh, fabric, or other flexible material that may be wrapped around at least a portion of the fiber layers in order to create the first layer (e.g., the projectile resistant layer). It should be understood that the layers described herein may be added to and/or lined with the frame before, during, and/or after manufacturing, packaging, installation, or the like using the same or similar couplings as described with respect to operatively coupling the layers to each other. As such, the layers, including the fill material, may be pre-assembled to one or more of the segments 30, 40, 50, 60, or assembled to the one or more of the segments 30, 40, 50, 60 before and/or after the door frame 20 is installed in the door opening.

It should be understood that the door 12 and/or the door frame 20 may further comprise additional layers, each of which may comprise one or more fiber layers. For example, the door 12 and/or door frame 20 may have a second layer, third layer, fourth layer, or the like, each of which are formed from one or more fiber layers. In the instances where the door 12 and/or door frame 20 comprise multiple projectile resistant layers of one or more fiber layers, each of the projectile resistant layers may be the same or different with respect to the number of the fiber layers therein, arrangement/ordering of the fiber layers therein, characteristics of the fiber layers therein, and/or the like.

Referring to the additional layers of the door 12 and/or door frame 20, the one or more additional layers may comprise a sheet (e.g., a porous sheet), which may typically comprise a material having a plurality of apertures in the form of voids, cavities, hollow interior chambers, surface hollows, slots, and/or through holes. These plurality of apertures may extend over a portion of a thickness, length, and/or width of the sheet, and/or they may extend over the entirety of the thickness, length, and/or width of the sheet. Additionally, the plurality of apertures may extend only partially into the sheet (e.g., embossed into the sheet), or the plurality of apertures may be through holes. Moreover, in some embodiments, the sheet may be a porous sheet, such as, a foam sheet. The foam sheet may be made from a metal, such as aluminum or its alloys. The aluminum foam sheet is porous with a plurality of apertures that create a sponge-like structure and is ultra-light weight, resulting in aluminum foam sheet being able to float in water. The aluminum foam sheet is non-flammable and does not emit any toxic gases. Moreover, the porosity of the aluminum foam sheet (e.g., the air-filled voids in particular), provide acoustic absorption and electromagnetic shielding. The aluminum foam sheet may be manufactured from recycled materials.

The foam sheet may comprise a thickness in the range of about 0.05 to 1.875 inches (or in some embodiments up to 3 inches or more for thicker doors and/or door frames 20). In some embodiments, the foam sheet comprises a thickness of about 0.1, 0.15, 0.20, 0.25, 0.3, 0.35, 0.40, 0.45 to 0.70, 0.75, 0.80, 0.85, 0.9, 0.95, 1, 1.1, 1.2, 1.3, 1.4, 1.5, 1.6, 1.7, 1.8, 1.875, or more inches and a density of about 0.63 lbs./sq. ft (0.55, 0.57, 0.59, 0.61, 0.65, 0.67, 0.69, 0.71, or the like). However, it should be understood that the foam sheet may have any thickness and/or any density (e.g., having a range that falls between, overlaps, and/or falls outside of any of the forgoing values). While the foam sheet may be made of aluminum, in some embodiments, the foam sheet is made from other metals, steel, alloys, minerals, plastics, composites, organic materials, polymers, etc. In some embodiments, the sheet is a grating framework made from suitable metals (e.g., aluminum), steel, alloys, minerals, plastics, composites, organic materials, polymers, etc.

With respect to the one or more additional layers of a fill material, the fill material may comprise an undifferentiated whole structure, a collection of discrete structures, and/or combinations thereof. In the embodiments where the fill material comprises an undifferentiated whole structure, the fill material may be in the form of a solid or foamed sheet. In this regard, the fill material may be a polystyrene sheet having a thickness in the range of about 0.1, 0.15, 0.20, 0.25, 0.3, 0.35, 0.40, 0.45 to 0.70, 0.75, 0.80, 0.85, 0.9, 0.95, 1, 1.1, 1.2, 1.3, 1.4, 1.5, 1.6, 1.7, 1.8, 1.875, or more. However, it should be understood that the fill material may have any thickness (e.g., ranges between, overlaps, and/or falls outside of any of the forgoing values). In the embodiments where the fill material comprises a collection of discrete structures, the fill material may be in the form of pellets, spheroids, grains, or the like. It should be understood that the fill material may be a solid material, or it may be a liquid material that later becomes solid. In some embodiments, the fill material may provide insulation for the door 12 and/or door frame 20.

In some embodiments, the fill material may be a homogenous cementitious material (e.g., concrete, or the like), a composite cementitious material (e.g., including a mixture of cementitious material and/or other materials, such as fibers, foam, or the like). It should be understood that cementitious means any type of cement or other like material, such as traditional cement, fly ash, blast-furnace slag, limestone fines, aggregate, and/or other types of cementitious materials, alone or in combination with each other. The fill material, such as the composite cementitious material, may be much lighter than traditional homogenous cementitious material. For example, the fill material 140 may be 10, 20, 30, 40, 50, 60, 70, or the like percent lighter than traditional cementitious material, or range between, overlap, and/or fall outside of any of these values. It should be understood that the cementitious material may be inserted into (e.g., poured, or the like) into the cavity in the form of a liquid fill material (e.g., completely liquid, liquid having particulates, and/or the like) which then hardens into a solid core.

The arrangement of the layers in the door 12 and/or door frame 20 will now be described in accordance with some embodiments of the invention. In some embodiments, one or more additional layers of a sheet and/or one or more additional layers of a fill material may be positioned in between a first layer, a second layer, and a third layer, each of which has one or more fiber layers. In other embodiments, a pair of layers (e.g., a first layer and a second layer) may be positioned adjacent each other. In yet other embodiments, a sheet (e.g., porous sheet) and a layer of a fill material may be placed next to each other. That said, the one or more layers, each comprising one or more fiber layers, and the one or more additional layers comprising one or more sheets and/or one or more filler layers may be arranged in any suitable order and in any suitable combination, based on the desired application. In some embodiments, the one or more additional layers of a sheet may be operatively coupled to the one or more fiber layers. In some embodiments, the one or more one or more filler layers may be operatively coupled to the one or more fiber layers. It should be understood that the one or more fiber layers, the one or more porous sheets, and/or the one or more filler layers may be operatively coupled to each other as was previously described with respect to operatively coupling the multiple fiber layers together (e.g., fasteners, adhesive, bounding, or the like).

The door 12 and/or door frames 20 of the present disclosure may provide outstanding resistance to and protection from a variety of physical impacts by projectiles. In particular, even though the fiber layers of the door 12 and/or door frame 20 are extremely thin (e.g., about 0.02 inches thick), the fiber layers (e.g., 30 fiber layers, 16 fiber layers, 14 fiber layers, 8 fiber layers, 6 fiber layers, 4 fiber layers, 2 fiber layers, or a single fiber layer, arranged in a stacked formations) are structured to provide various UL level protection from ballistic projectiles (e.g., firearm, or the like) and also protection from other projectiles such as debris or shrapnel. As such, the one or more projectile resistant layers, each comprising the one or more fiber layers (e.g., fabric layer, plastic layers, or the like as discussed herein), may alone or in combination with other layers, provide a door 12 and/or door frame 20 that provides the desired FE (forced entry) and/or BR (Bullet Resistant) properties while providing reduced weights and/or improved shipping and/or installation processes. For example, the door 12 and/or door frame 12 may have UL752 Level 1 (9 mm handgun) to UL 752 Level 10 (.50 Caliber Rifle) protection, and in particular embodiments UL752 level 1 (9 mm), UL752 level 2 (.357 Magnum), UL752 level 3 (.44 Magnum), UL752 level 4 (.30 Caliber Rifle), UL752 level 5 (7.63 Caliber Rifle) UL752 level 6 (9 mm Rifle), UL752 level 7 (5.56 mm), UL752 level 8 (7.62 mm), UL752 level 9 (.30-06 rifle), UL752 level 10 (.50 caliber rifle), or the like protection (e.g., as defined at the time of filing this application), or have protection that ranges between, overlaps, or falls outside of these levels of protection. Furthermore, the door 12 and/or door frame 20 may also be rated to withstand 5, 10, 15, 20, 25, 30, 40, 50, 60, or the like minutes of simulated "mob" attack, or range between, overlap, or outside of these levels of protection. In some embodiments of the invention, the fiber layers may be fabric layers of basalt woven fabric, other similar material. In some embodiments of the invention, the fiber layers may be plastic layers of UHMWPE. In some embodiments of the invention, the one or more projectile resistant layers may comprise other types of materials, such as, but not limited to Kevlar or other Bullet resistant fabrics (e.g., woven fabric, non-woven fabric, knitted fabric, other fabrics, or the like) or bullet resistant plastic that provide the same or similar protection as described with respect to the fiber layers. The protective or filler layers and materials can be added separately, or may be bonded together using structural adhesives, resins, heat, mechanical or other similar means. Furthermore, the costs of the various layers of the composite door systems are about half the cost of conventional materials without adding bulk to the composite door systems 1 (e.g., doors 12 and/or door frame 20 in which they are used).

Moreover, the sheet layers, such as a porous sheet (e.g., the aluminum foam, or the like), used in the door and/or door frame 20 are structured to exhibit electrical resistance (e.g., because it does not conduct electricity), provide electronic shielding from radio frequency and medium frequency waves, provide fire protection (e.g., because it is noninflammable), and provide various other properties that conventional materials are not able to provide. In other embodiments, the sheet layers may comprise a polycarbonate, SGG material, or other type of foam sheet.

Furthermore, fill material is described generally herein as providing additional material in order to fill out the thickness of the door 12 and/or the door frame 20, and in some embodiments provide an insulated core to at least a portion of the door 12 and/or door frame 20. While the fill material is generally described as being a polystyrene sheet or other type of structure (e.g., loose material, or the like), it should be understood that the fill material may be any type of material (e.g., lightweight, or the like), such as, but not limited to a polyisocyanurate, polyurethane, fiberglass, cellulose, mineral wool, kraft paper (e.g., structural, or the like), plastics, polycarbonates, vermiculite, perlite, cementitious foam (e.g., magnesium oxide, such as magnesium silicate), phenolic foam, or other like material. Regardless of the fill material, it may provide structural, protective, sound transmission prevention, fire resistance or fire proofing, or the like properties. In some embodiments the fill material may also have projectile resistance (e.g., firearm, blast, weather related resistance—wind, projectile, or the like, mob attack) and/or may have other properties that provide chemical resistance, radio frequency resistance, electromagnetic resistance, or the like.

While the present invention is described herein as being used with respect to door frames, it should be understood that the embodiments of the door frame 20 described herein may be applied to any type of frame 300 for any type of barrier component, such as a sidelight, transom, borrowed lights, windows, or the like. FIGS. 15A through 15E illustrated different types of frames 300 which could use one or more embodiments of the invention described herein with respect to door frames 20. For example, FIG. 15A illustrates a door frame 20 and sidelight frame 310; FIG. 15B illustrate a door frame 20 and transom frame 320; FIG. 15C illustrates a door frame 20, a sidelight frame 310, and a transom frame 320; FIG. 15D illustrates a window frame 330; and FIG. 15E illustrates borrowed light frames 340. As such, the embodiments of the present invention discussed herein with respect to a door frame 20 may be utilized in any type of frame 300 in any type of barrier 2 (e.g., wall, or the like).

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and should not be interpreted in an idealized or overly formal sense unless expressly so defined herein. Certain terminology is used herein for convenience only and is not to be taken as a limitation on the invention. For example, words such as "distal," "proximal," "upper," "top," "bottom," "lower," "left," "right," "horizontal," "vertical," "upper," and "lower", or other like terminology merely describe the configuration shown in the figures. The referenced components may be oriented in an orientation other than that shown in the drawings and the terminology, therefore, should be understood as encompassing such variations unless specified otherwise.

It will be understood that when an element is referred to as "operatively coupled" to another element, the elements can be formed integrally with each other, or may be formed separately and put together. Furthermore, "operatively coupled" to can mean the element is directly coupled to the other element, or intervening elements may be present between the elements. Furthermore, "operatively coupled" may mean that the elements are detachable from each other, or that they are permanently operatively coupled together.

When components are described as being parallel or perpendicular to other components, it should be understood that this many encompass the components being exactly parallel or perpendicular, or generally parallel or perpendicular in which the components deviate from exactly parallel or perpendicular (e.g., +/−1, 2, 4, 6, 8, 10, 15, 20, 25, or the like degrees from exactly parallel or perpendicular).

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

INCORPORATION BY REFERENCE

To supplement the present disclosure, this application further incorporates entirely by reference the following commonly assigned patent applications:

| Docket Number | U.S. Patent Application Ser. No. | Title | Filed On |
| --- | --- | --- | --- |
| 014924-000028 | To be assigned | ADJUSTABLE FRAME WITH A THERMAL BREAK SEAL | Concurrently herewith |
| 044824-000006 | To be assigned | SECURITY FEATURES FOR A SLIDING DOOR SYSTEM | Concurrently herewith |
| 044824-000008 | To be assigned | ADJUSTABLE DOOR FRAME FOR A SLIDING DOOR | Concurrently herewith |

What is claimed is:

1. A frame for an opening comprising:
   at least one first frame segment;
   at least one second frame segment;
   at least one soffit frame segment comprising:
      a first soffit stop flange;
      a soffit face flange adjacent to the first soffit stop flange;
      a second soffit stop flange adjacent the soffit face flange; and a soffit mounting flange adjacent the second soffit stop flange;
one or more adjustment members operatively coupled to the at least one first frame segment or the at least one second frame segment; and
wherein the second frame segment is adjustable with respect to the first frame segment through the one or more adjustment members; and
wherein the at least one soffit frame segment covers a portion of the at least one first frame segment and a portion of the at least one second frame segment.

2. The frame of claim 1, further comprising:
one or more thermal barriers between a portion of the at least one first frame segment and a portion of the at least one second frame segment.

3. The frame of claim 1, wherein the at least one first frame segment comprises one or more first adjustment members and the at least one second frame segment comprises one or more second adjustment members, wherein the at least one second frame segment is adjustable with respect to the at least one first frame segment through the one or more first adjustment members and the one or more second adjustment members.

4. The frame of claim 3, wherein the first frame segment comprises one or more access apertures, wherein the one or more access apertures are configured to allow the one or more first adjustment members to be operatively coupled to the one or more second adjustment members through a portion of the first frame segment as the frame is installed in the opening.

5. The frame of claim 1, wherein the at least one second frame segment is adjustable with respect to the at least one first frame segment and the at least one soffit frame segment.

6. The frame of claim 1, wherein alternate soffit frame segments may be interchanged to allow for alternate frame widths.

7. The frame of claim 1, further comprising:
one or more connectors, wherein the one or more connectors extend through the at least one second frame segment, one of one or more barriers, and the at least one soffit frame segment.

8. The frame of claim 1, wherein the at least one first frame segment comprises:
a first molding flange;
a first jamb flange adjacent to the first molding flange;
a first stop flange adjacent to the first jamb flange; and
a first face flange adjacent to the first stop flange.

9. The frame of claim 1, wherein the at least one second frame segment comprises:
a second molding flange; and
a second jamb flange adjacent to the second molding flange;
wherein the one or more adjustment members are one or more second adjustment members adjacent to the second jamb flange.

10. The frame of claim 1, further comprising:
one or more connectors, wherein the one or more connectors operatively couple the one or more adjustment members of the at least one second frame segment to the at least one first frame segment.

11. The frame of claim 10, wherein the one or more adjustment members comprise one or more adjustment tabs having one or more apertures, and wherein the one or more connectors operatively couple the one or more adjustment tabs to the at least one first frame segment.

12. The frame of claim 1, further comprising:
an adjustment mounting segment operatively coupled to the first frame segment; and
wherein the one or more adjustment members are operatively coupled to the adjustment mounting segment.

13. The frame of claim 12, wherein the adjustment mounting segment comprises:
an adjustment stop flange;
an adjustment face flange extending from the adjustment stop flange; and
an adjustment mounting flange extending from the adjustment stop flange.

14. A frame for an opening, the frame comprising:
at least one first frame segment for upper or side portions of the opening, the at least one first frame segment having a first molding flange, a first jamb flange adjacent to the first molding flange, a first stop flange adjacent to the first jamb flange and a first face flange adjacent to the first stop flange; and
at least one second frame segment for the upper or side portions of the opening, the at least one second frame segment having a second molding flange and a second jamb flange adjacent to the second molding flange,
at least one soffit frame segment, the at least one soffit frame segment having a first soffit stop flange, a soffit face flange adjacent to the first soffit stop flange, a second soffit stop flange adjacent the soffit face flange, and a soffit mounting flange adjacent the second soffit stop flange; and
one or more adjustment members operatively coupled to the at least one first frame segment or the at least one second frame segment;
wherein the at least one first frame segment is adjustable with respect to the at least one second frame segment through the one or more adjustment members; and
wherein the first soffit stop flange extends over at least a portion of the first stop flange and at least a portion of the first face flange, and wherein the soffit mounting flange extends over at least a portion of the second jamb flange.

15. The frame of claim 14, further comprising:
one or more barriers between the first stop flange and the first soffit stop flange, between the first face flange and the soffit face flange, between the second jamb flange and the soffit mounting flange, and between the first jamb flange and the one or more adjustment members, wherein the one or more barriers form a thermal break that reduces thermal conduction between the at least one first frame segment and the at least one second frame segment.

16. A method of forming a frame, the method comprising:
adjusting at least one first frame segment with respect to at least one second frame segment through one or more adjustment members;
securing the at least one first frame segment to the at least one second frame segment through one or more connectors; and
securing at least one soffit frame segment to the at least one first frame segment or the at least one second frame segment;
wherein the at least one soffit frame segment comprises:
a first soffit stop flange;
a soffit face flange adjacent to the first soffit stop flange;
a second soffit stop flange adjacent the soffit face flange; and
a soffit mounting flange adjacent the second soffit stop flange;

wherein the at least one soffit frame segment covers a portion of the at least one first frame segment and a portion of the at least one second frame segment.

17. The method of claim 16, further comprising:
applying one or more barriers between the least one first frame segment and the at least one second frame segment;
wherein the at least one soffit frame segment is secured to the at least one first frame segment or the at least one second frame segment through the one or more connectors;
wherein the one or more barriers are further applied between the at least one first frame segment and the at least one soffit segment and the at least one second frame segment and the at least one soffit segment.

* * * * *